(12) United States Patent
Shealy

(10) Patent No.: US 9,917,568 B2
(45) Date of Patent: Mar. 13, 2018

(54) MEMBRANE SUBSTRATE STRUCTURE FOR SINGLE CRYSTAL ACOUSTIC RESONATOR DEVICE

(71) Applicant: Akoustis, Inc., Cornelius, NC (US)

(72) Inventor: Jeffrey B. Shealy, Cornelius, NC (US)

(73) Assignee: AKOUSTIS, INC., Huntersville, NC (US)

( * ) Notice: Subject to any disclaimer, the term of this patent is extended or adjusted under 35 U.S.C. 154(b) by 704 days.

(21) Appl. No.: 14/469,503

(22) Filed: Aug. 26, 2014

(65) Prior Publication Data

US 2016/0065172 A1    Mar. 3, 2016

(51) Int. Cl.
*H03H 9/17*     (2006.01)
*H03H 3/02*     (2006.01)

(52) U.S. Cl.
CPC .............. *H03H 9/174* (2013.01); *H03H 3/02* (2013.01); *H03H 2003/023* (2013.01)

(58) Field of Classification Search
CPC ..... H03H 9/174; H03H 3/02; H03H 2003/023
USPC ................. 310/321, 320; 438/55, 48, 57, 99
See application file for complete search history.

(56) References Cited

U.S. PATENT DOCUMENTS

| | | | |
|---|---|---|---|
| 5,231,327 A | 7/1993 | Ketcham | |
| 5,894,647 A | 4/1999 | Lakin | |
| 6,051,907 A | 4/2000 | Ylilammi | |
| 6,114,635 A | 9/2000 | Lakin et al. | |
| 6,262,637 B1 | 7/2001 | Bradley et al. | |
| 6,377,137 B1 | 4/2002 | Ruby | |
| 6,384,697 B1 | 5/2002 | Ruby | |
| 6,472,954 B1 | 10/2002 | Ruby et al. | |
| 6,617,060 B2 | 9/2003 | Weeks, Jr. et al. | |
| 6,812,619 B1 | 11/2004 | Kaitila et al. | |
| 6,841,922 B2 | 1/2005 | Aigner et al. | |
| 6,864,619 B2 | 3/2005 | Aigner et al. | |
| 6,879,224 B2 | 4/2005 | Frank | |
| 6,909,340 B2 | 6/2005 | Aigner et al. | |
| 6,933,807 B2 | 8/2005 | Marksteiner et al. | |
| 7,112,860 B2 | 9/2006 | Saxler | |
| 7,250,360 B2 | 7/2007 | Shealy et al. | |
| 7,268,436 B2 | 9/2007 | Aigner et al. | |
| 7,365,619 B2 | 4/2008 | Aigner et al. | |
| 7,514,759 B1 * | 4/2009 | Mehta ................. | B81C 1/00246 257/416 |
| 7,875,910 B2 | 1/2011 | Sheppard et al. | |
| 7,982,363 B2 | 7/2011 | Chitnis | |
| 8,304,271 B2 | 11/2012 | Huang et al. | |
| 9,299,914 B2 * | 3/2016 | Asai ..................... | H03H 9/0542 |
| 9,537,465 B1 * | 1/2017 | Shealy ................... | H01L 41/39 |

* cited by examiner

*Primary Examiner* — Thomas Dougherty
*Assistant Examiner* — Karen B Addison
(74) *Attorney, Agent, or Firm* — Richard T. Ogawa; Ogawa P.C.

(57) ABSTRACT

A substrate structure for an acoustic resonator device. The substrate has a substrate member comprising a plurality of support members configured to form an array structure. In an example, the substrate member has an upper region, and optionally, has a plurality of recessed regions configured by the support members. The substrate has a thickness of single crystal piezo material formed overlying the upper region. In an example, the thickness of single crystal piezo material has a first surface region and a second surface region opposite of the first surface region.

16 Claims, 20 Drawing Sheets

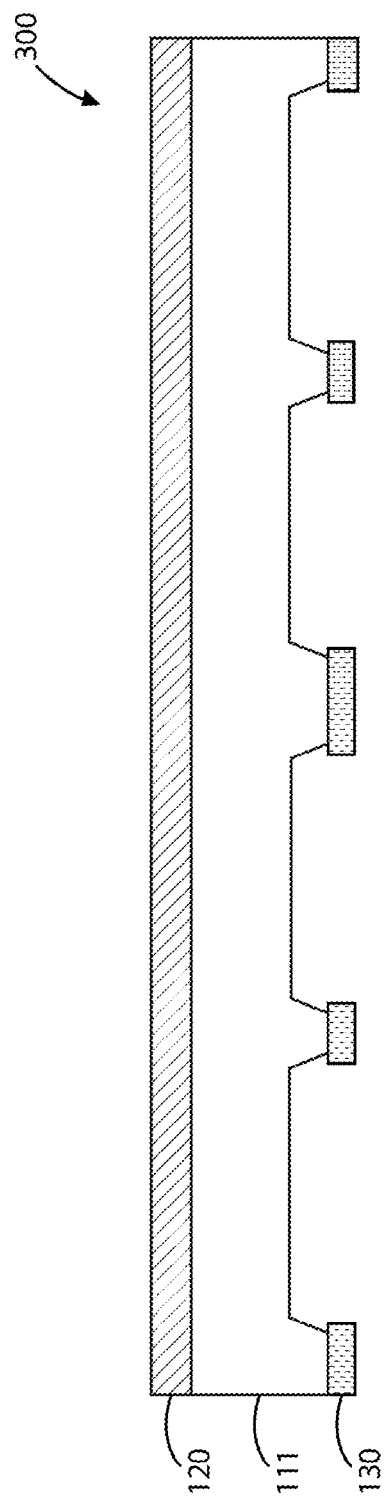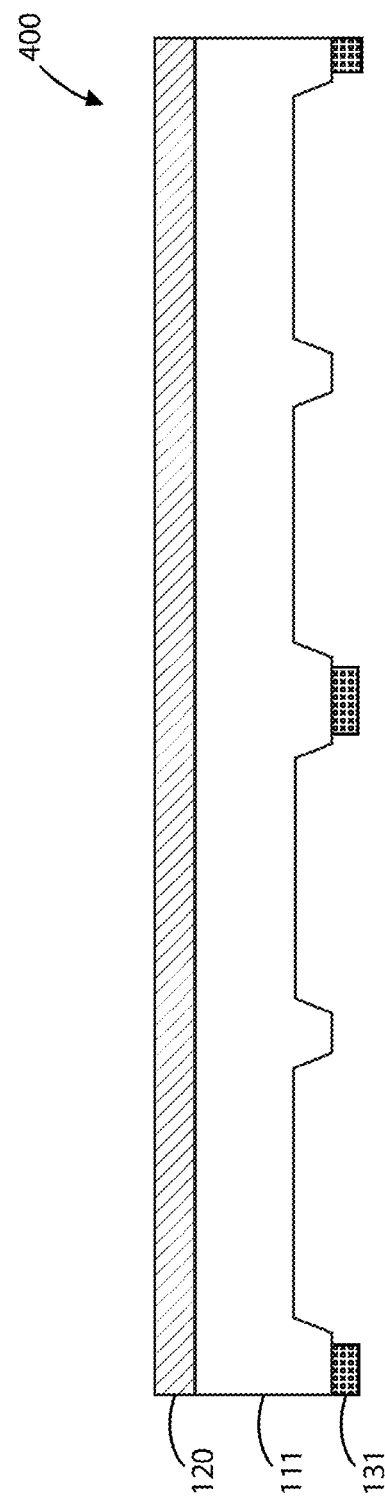

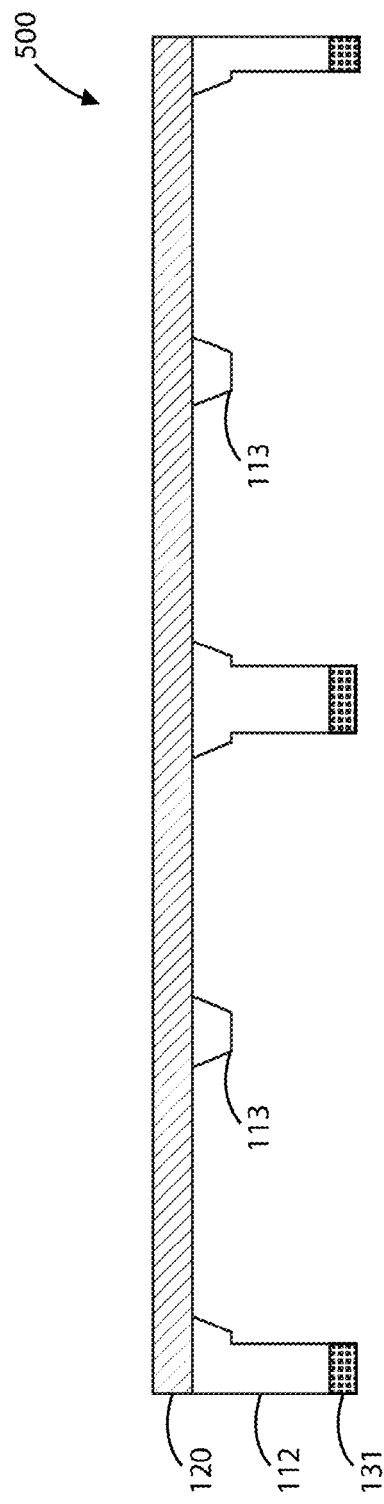
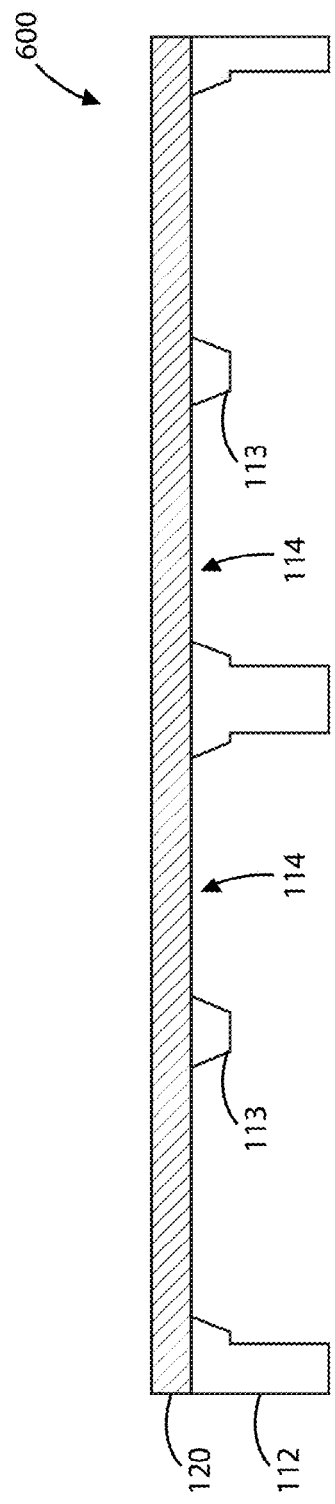

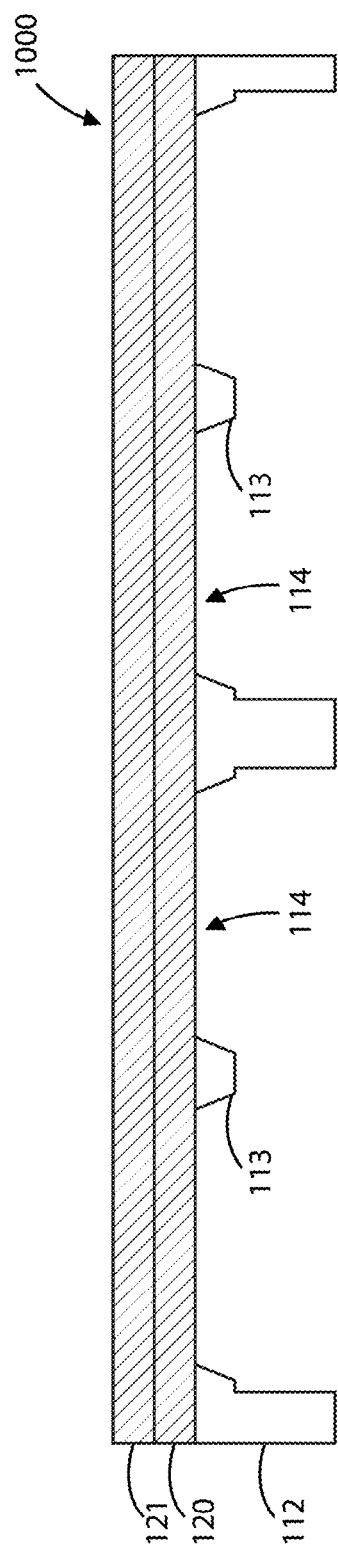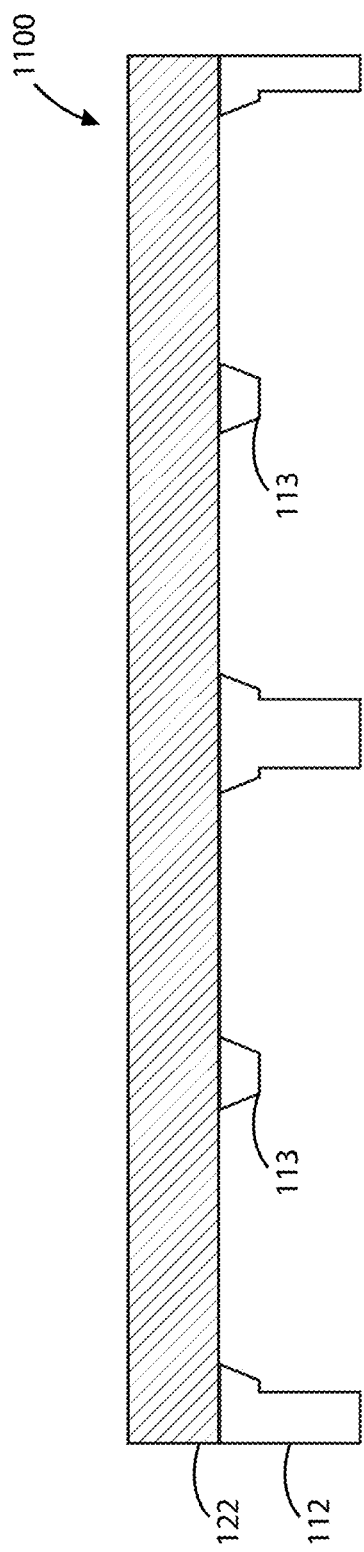

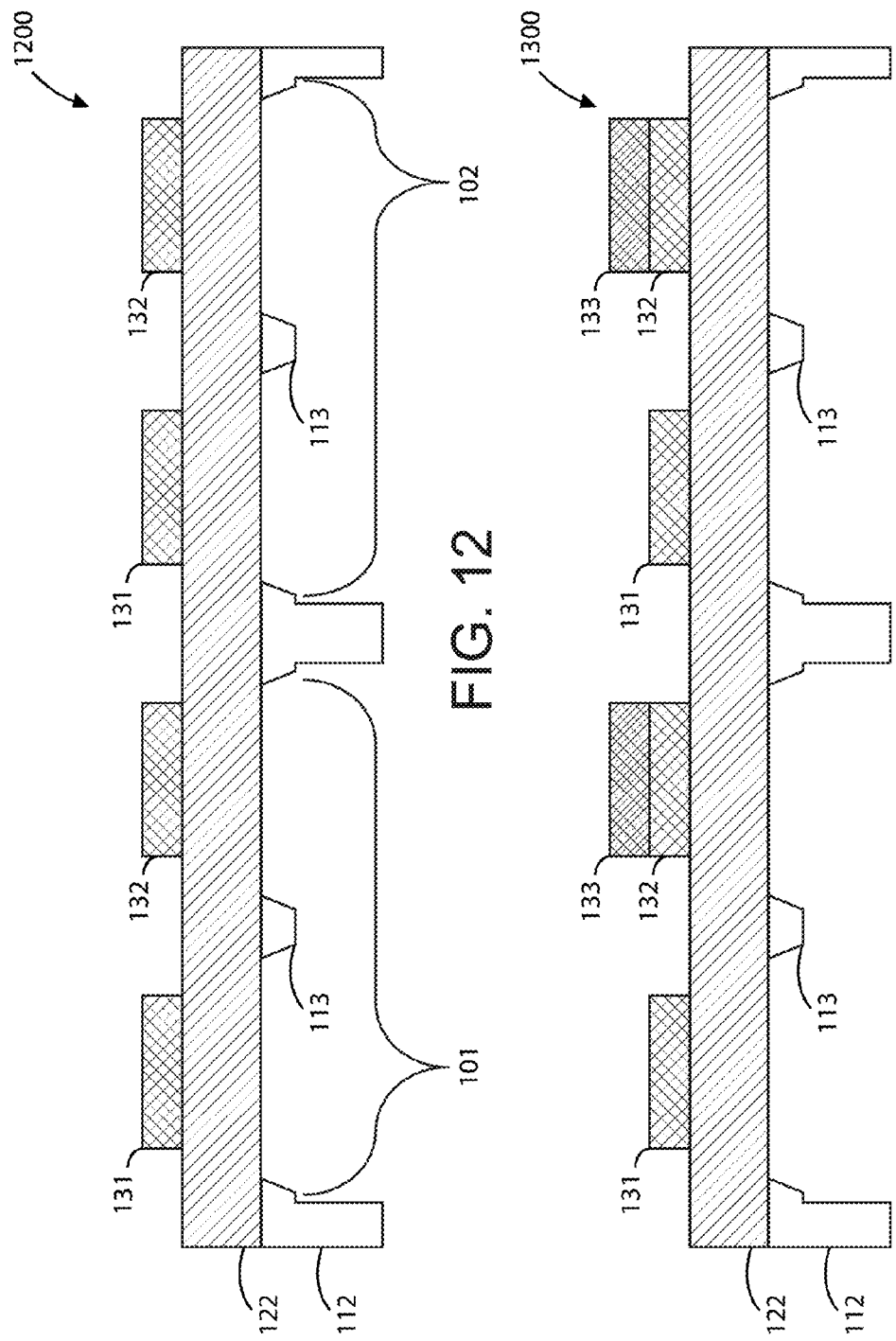

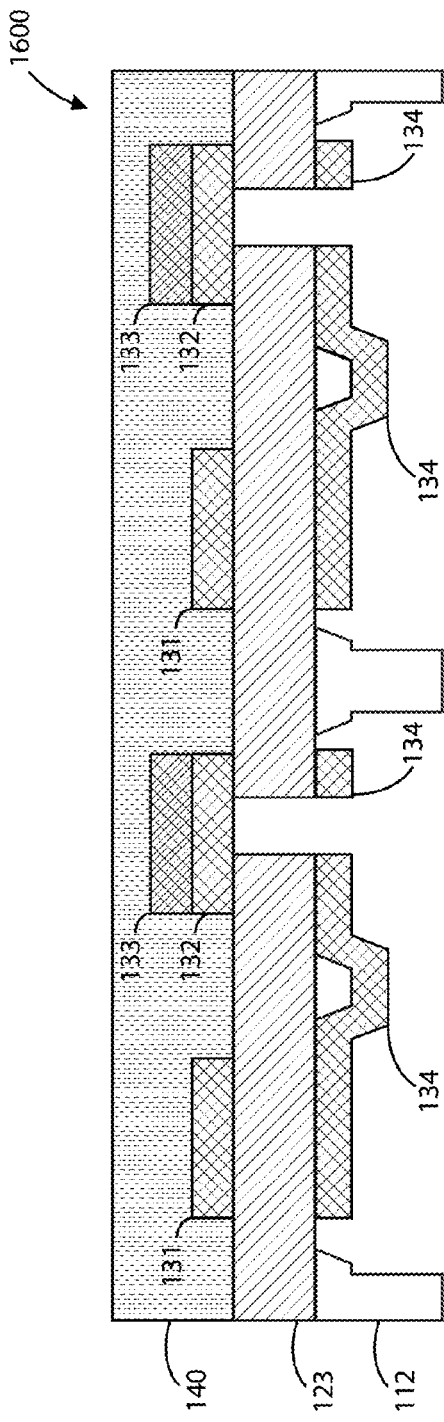
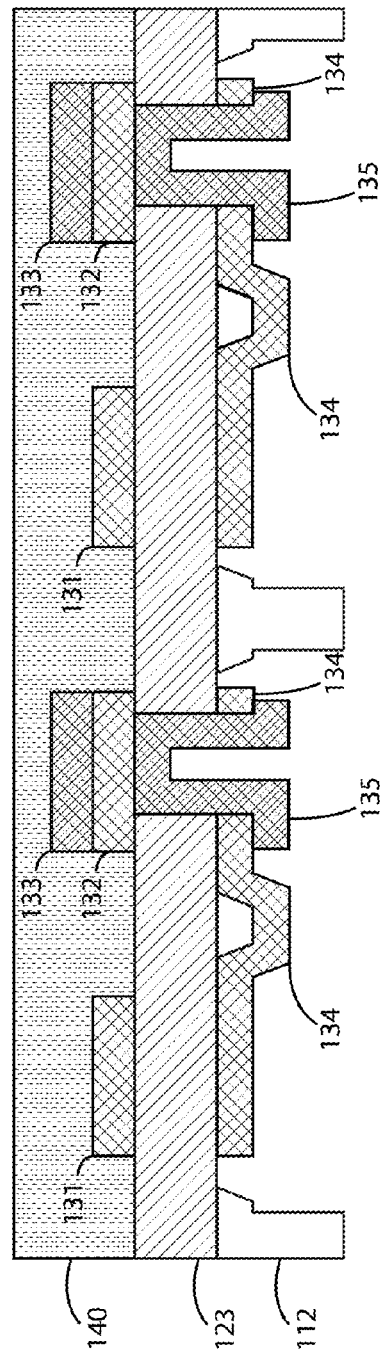
FIG. 16
FIG. 17

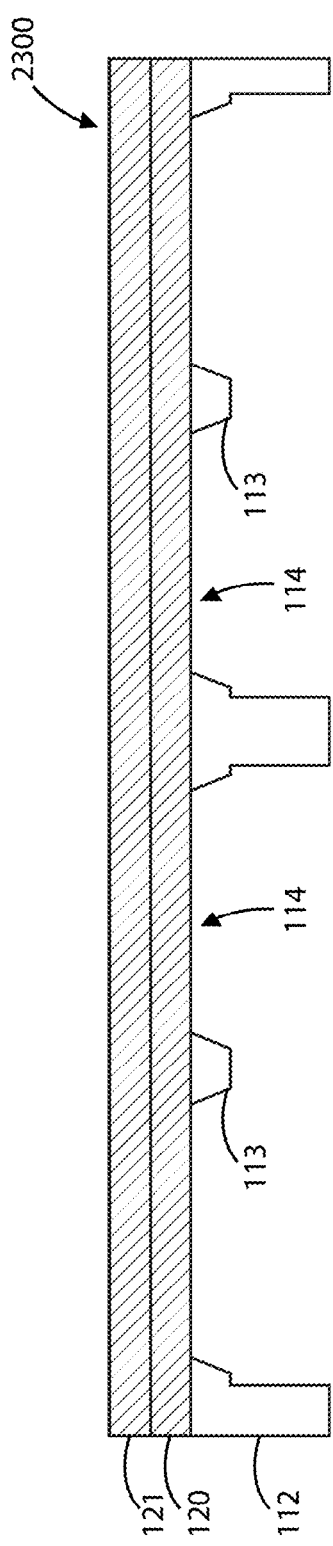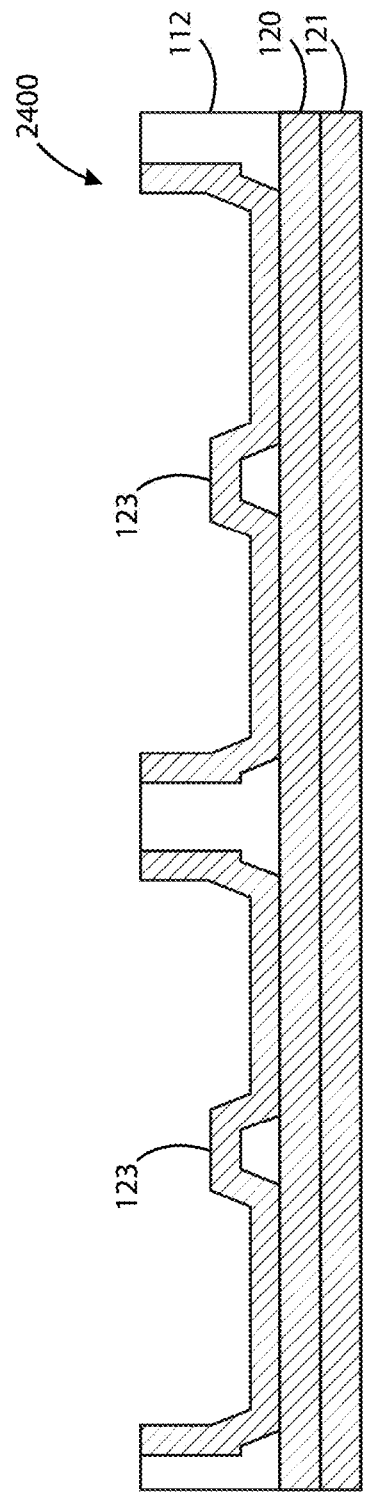

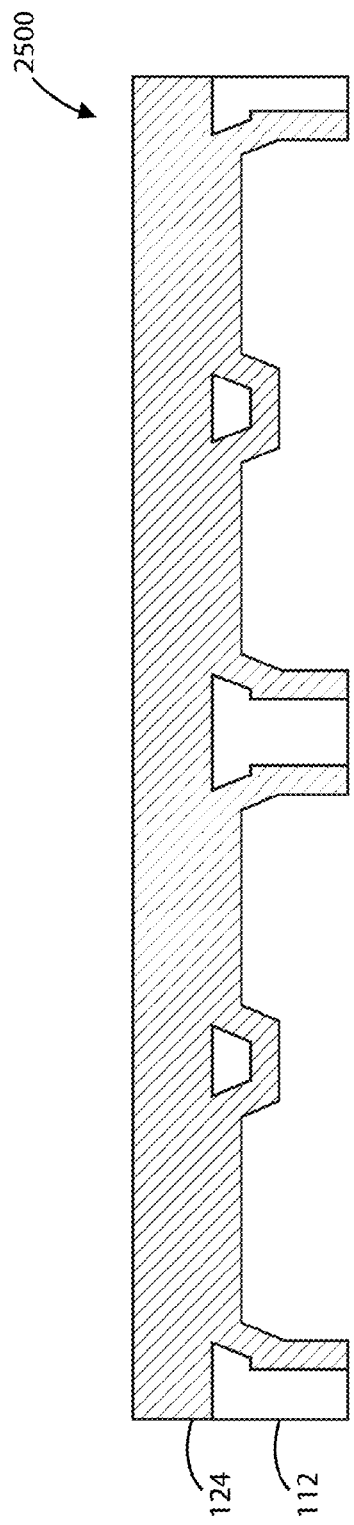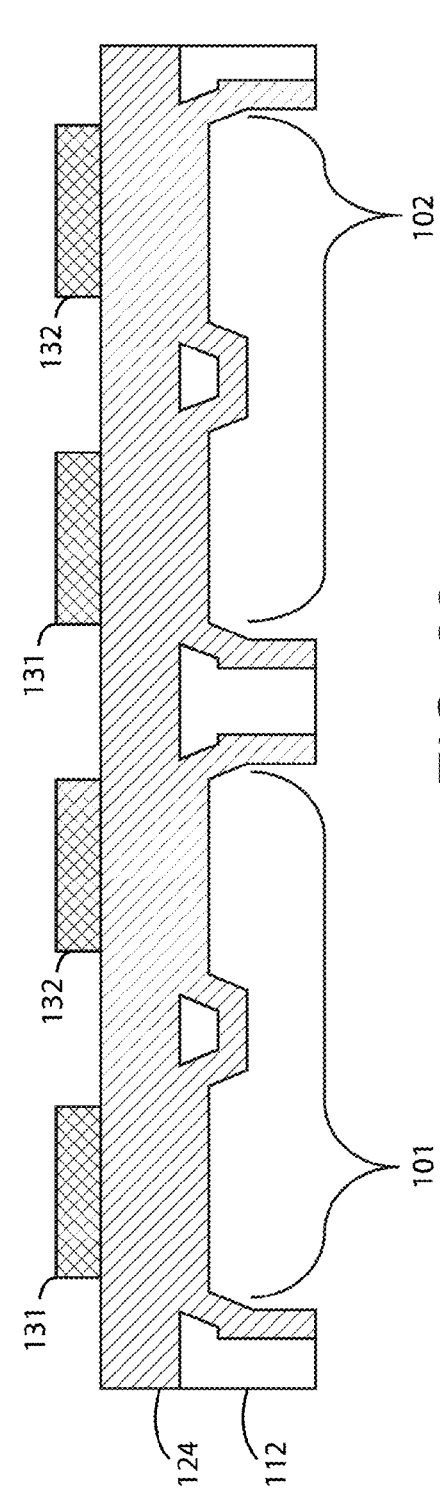

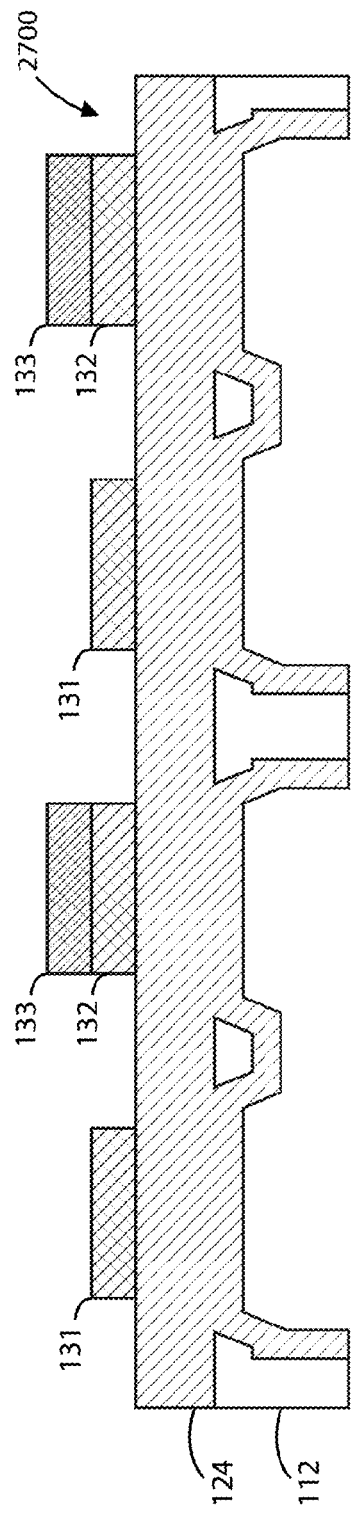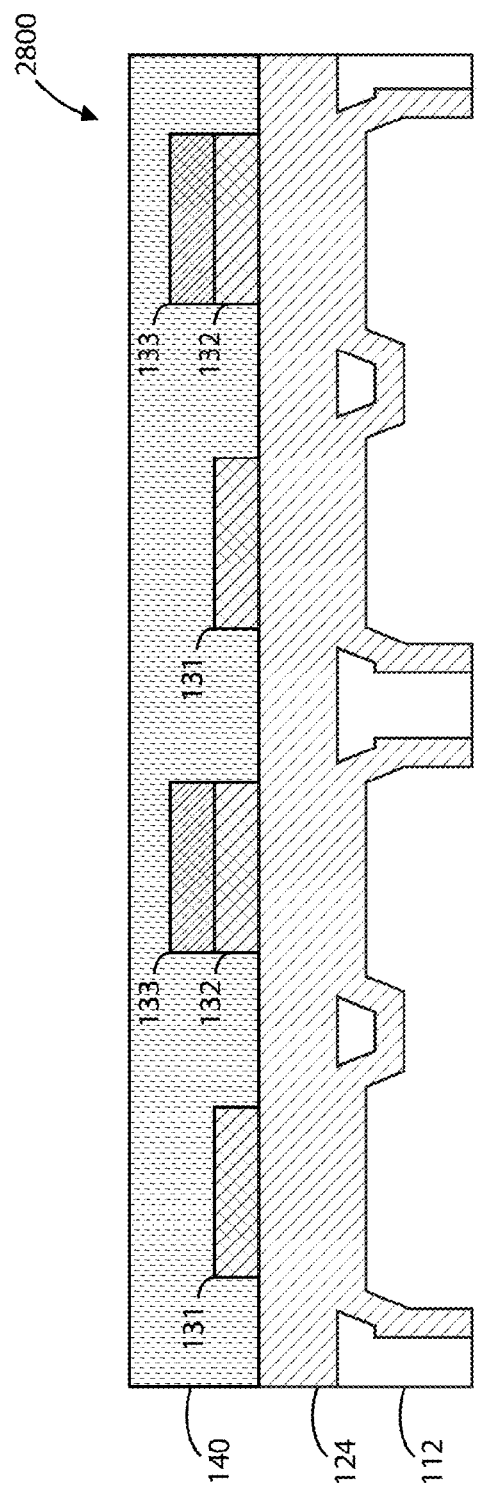

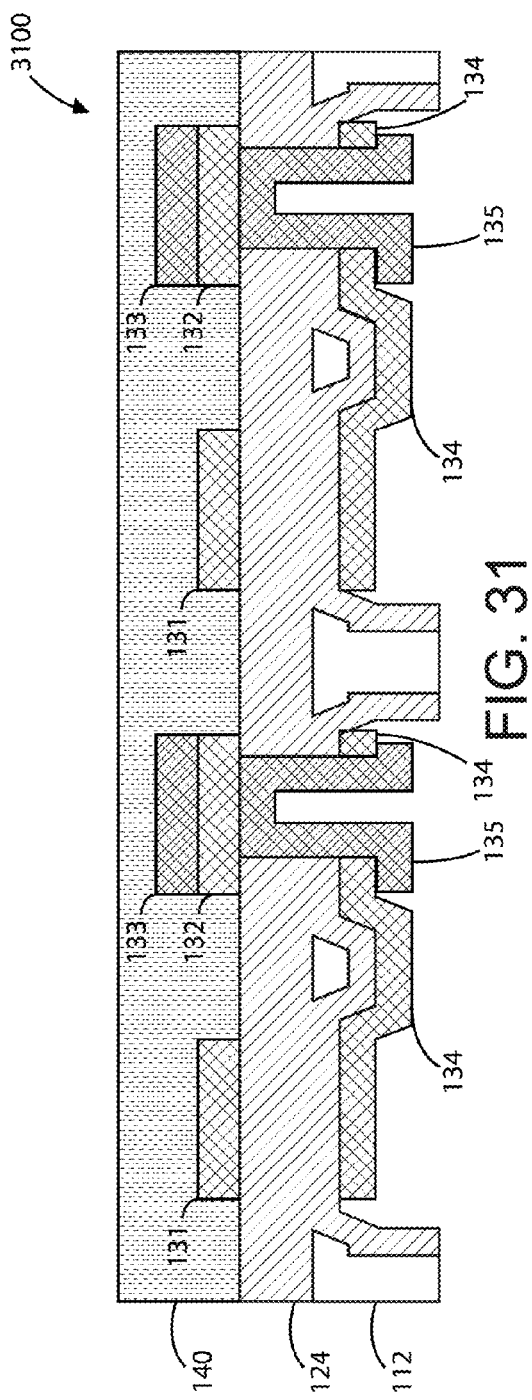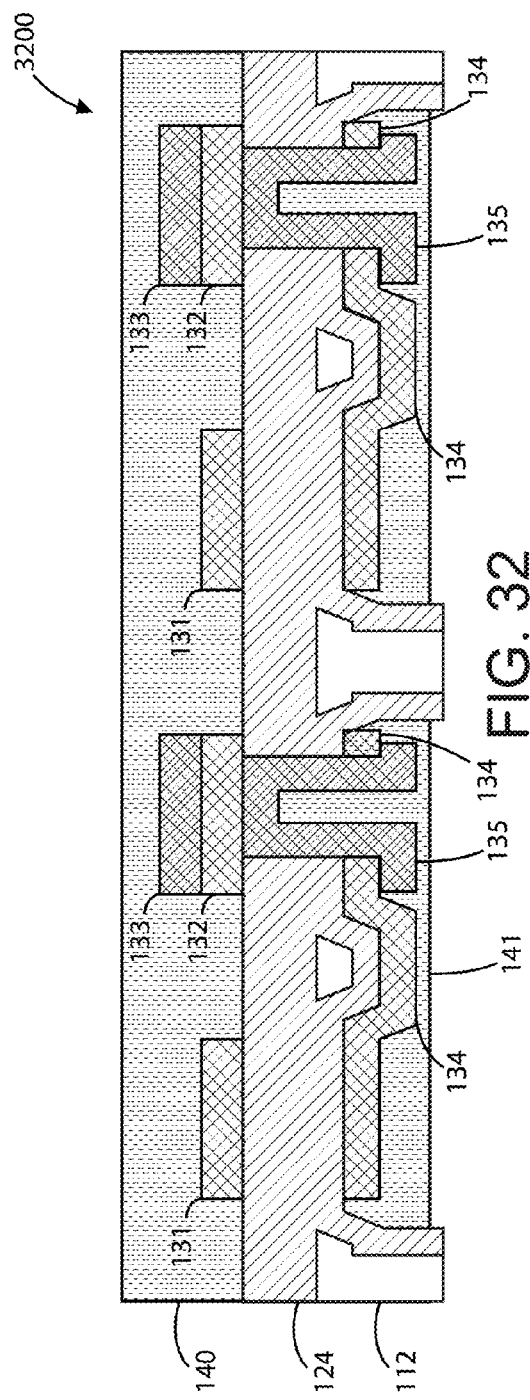

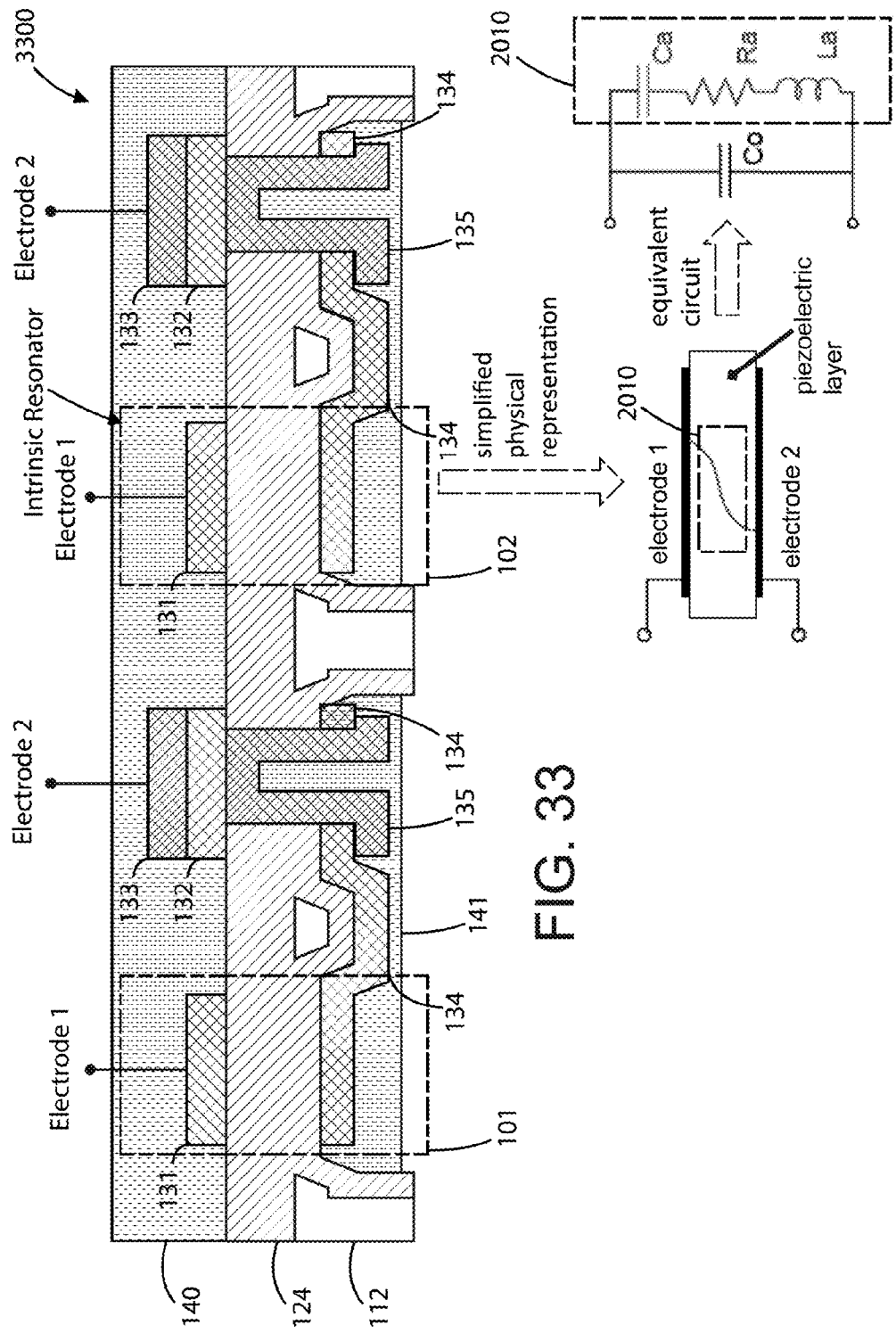

MEMBRANE SUBSTRATE STRUCTURE FOR SINGLE CRYSTAL ACOUSTIC RESONATOR DEVICE

CROSS-REFERENCES TO RELATED APPLICATIONS

The present application incorporates by reference, for all purposes, the following concurrently filed patent applications, all commonly owned: U.S. patent application Ser. No. 14/298,057, titled "RESONANCE CIRCUIT WITH A SINGLE CRYSTAL CAPACITOR DIELECTRIC MATERIAL", filed Jun. 6, 2014, U.S. patent application Ser. No. 14/298,076, titled "METHOD OF MANUFACTURE FOR SINGLE CRYSTAL CAPACITOR DIELECTRIC FOR A RESONANCE CIRCUIT", filed Jun. 6, 2014, U.S. patent application Ser. No. 14/298,100, titled "INTEGRATED CIRCUIT CONFIGURED WITH TWO OR MORE SINGLE CRYSTAL ACOUSTIC RESONATOR DEVICES", filed Jun. 6, 2014, U.S. patent application Ser. No. 14/341,314, titled "WAFER SCALE PACKAGING", filed Jul. 25, 2014, and U.S. patent application Ser. No. 14/449,001, titled "MOBILE COMMUNICATION DEVICE CONFIGURED WITH A SINGLE CRYSTAL PIEZO RESONATOR STRUCTURE", filed Jul. 31, 2014.

BACKGROUND OF THE INVENTION

The present invention relates generally to electronic devices. More particularly, the present invention provides techniques related to a wafer scale packaging for a resonator device. Merely by way of example, the invention has been applied to a resonator device for a communication device, mobile device, computing device, among others.

Mobile telecommunication devices have been successfully deployed world-wide. Over a billion mobile devices, including cell phones and smartphones, were manufactured in a single year and unit volume continues to increase year-over-year. With ramp of 4G/LTE in about 2012, and explosion of mobile data traffic, data rich content is driving the growth of the smartphone segment—which is expected to reach 2 B per annum within the next few years. Coexistence of new and legacy standards and thirst for higher data rate requirements is driving RF complexity in smartphones. Unfortunately, limitations exist with conventional RF technology that is problematic, and may lead to drawbacks in the future.

From the above, it is seen that techniques for improving electronic devices are highly desirable.

BRIEF SUMMARY OF THE INVENTION

According to the present invention, techniques generally related to electronic devices are provided. More particularly, the present invention provides techniques related to a single crystal acoustic resonator. Merely by way of example, the invention has been applied to a resonator device for a communication device, mobile device, computing device, among others.

In an example, the present invention provides a substrate structure for an acoustic resonator device. The substrate has a substrate member comprising a plurality of support members configured to form an array structure. In an example, the substrate member has an upper region, and optionally, has a plurality of recessed regions configured by the support members. The substrate has a thickness of single crystal piezo material formed overlying the upper region. In an example, the thickness of single crystal piezo material has a first surface region and a second surface region opposite of the first surface region. In an example, the structure has a plurality of exposed regions of the second surface region of the thickness of single crystal piezo material, each of the exposed regions configured by at least a pair of support members and is configured to form an element of the array structure.

In an alternative example, the invention provides a method of forming an acoustic resonator device. The method includes providing a substrate member comprising a plurality of support members configured to form an array structure. In an example, the substrate member has an upper region. In an example, the method includes forming a thickness of single crystal piezo material formed overlying the upper region. In an example, the thickness of single crystal piezo material has a first surface region and a second surface region opposite of the first surface region such that the thickness of single crystal piezo material has a plurality of exposed regions of the second surface region of the thickness of single crystal piezo material. Each of the exposed regions configured by at least a pair of support members and is configured to form an element of the array structure.

In an example, the present invention provides for a single crystal AlN dielectric that exhibits the highest piezoelectric constant of any III-Nitride materials (1.55 C/m2). In an example, the single-crystal AlN grown on silicon by CVD (e.g. MOCVD) is limited to approximately 0.4 um without cracking. In an example, a 2.2 um of AlN is desirable to develop LTE acoustic wave filters for smartphone. Therefore, a material approach is desired to obtain highest performance acoustic resonator for BAW filter. In one or more examples, the present techniques provides for growth of thin AlN layer on silicon; remove silicon to form membrane; Grow 2nd thick AlN layer on strain relieved AlN membrane.

One or more benefits are achieved over pre-existing techniques using the invention. In particular, the invention enables a cost-effective resonator device for communications applications. In a specific embodiment, the present device can be manufactured in a relatively simple and cost effective manner. Depending upon the embodiment, the present apparatus and method can be manufactured using conventional materials and/or methods according to one of ordinary skill in the art. The present device uses a gallium and nitrogen containing material that is single crystalline. Depending upon the embodiment, one or more of these benefits may be achieved. Of course, there can be other variations, modifications, and alternatives.

A further understanding of the nature and advantages of the invention may be realized by reference to the latter portions of the specification and attached drawings.

BRIEF DESCRIPTION OF THE DRAWINGS

In order to more fully understand the present invention, reference is made to the accompanying drawings. Understanding that these drawings are not to be considered limitations in the scope of the invention, the presently described embodiments and the presently understood best mode of the invention are described with additional detail through use of the accompanying drawings in which:

FIGS. 1 through 6 illustrate a simplified method for forming a membrane substrate structure for an acoustic resonator device according to an example of the present invention.

FIGS. 10-20 illustrate a simplified method of forming a single crystal acoustic resonator device according to an example of the present invention.

FIGS. 23 to 34 illustrate a simplified method for forming a membrane substrate structure and resulting device according to an example of the present invention.

DETAILED DESCRIPTION OF THE INVENTION

Figure 1:
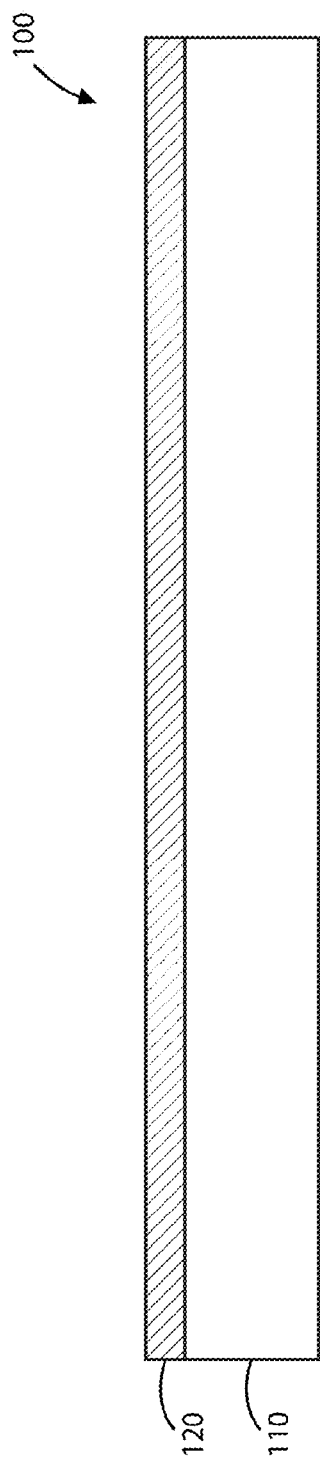

According to the present invention, techniques generally related to electronic devices are provided. More particularly, the present invention provides techniques related to a single crystal acoustic resonator. Merely by way of example, the invention has been applied to a resonator device for a communication device, mobile device, computing device, among others.

A method for forming a membrane structure configured for an acoustic resonator device can be outlined as follows:

1. Start;
2. Provide a silicon substrate member having a surface region configured in a <111> surface orientation and a backside region, the silicon substrate being single crystal silicon;
3. Place the silicon substrate member into a processing chamber configured with a temperature controlled surface containing the silicon substrate;
4. Increase a temperature of the surface region from a first temperature to a second temperature, and variations;
5. Maintain the surface region between 900 C and 1200 C to oblate the surface region having a silicon material and oblate any other unintentional species residing on the surface region;
6. Introduce at least nitrogen (N2) and trimethyl aluminum (TMA) entities into the process chamber at a flow rate of 1 cubic-centimeter (cc) per minute, or alternatively a trimethyl gallium (TMG) entities for GaN or a gallium and nitrogen containing growth;
7. Dissociate an aluminum species from the TMA to react with the silicon substrate to create a meta-stable surface layer of aluminum-rich species, or alternatively a gallium species from the TMG to react with the silicon substrate to create a meta-stable surface layer of gallium rich species;
8. Introduce at least an ammonia ($NH_3$) entity into the process chamber with a minimum flow rate of 0.33 liters per minute;
9. Dissociate a nitrogen species form the ammonia entity;
10. Cause formation of a first thickness of aluminum nitride crystalline material, using at least the nitrogen species and the aluminum species, overlying the surface region to form a strained state from a lattice mismatch between the surface region of the silicon substrate material and the first thickness of aluminum nitride crystalline material (or alternatively forming the GaN or gallium and nitrogen containing material;
11. Maintain the silicon substrate member at a temperature greater than about 900 Degrees Celsius to 1200 Degrees Celsius during the formation of the first thickness of aluminum nitride crystalline material (or GaN crystalline material);
12. Subject the backside region to a thinning process to remove a thickness of the substrate member to a thickness ranging from 30 microns to about 300 microns;
13. Form a plurality of patterns formed on the backside region to form a patterned silicon carrier member configured to expose a plurality of backside portions of the aluminum nitride crystalline material;
14. Cause the first thickness of aluminum nitride crystalline material in the strained state to relax the first thickness of aluminum nitride crystalline material to form a supported membrane structure configured on the patterned carrier member;
15. Form electrodes, contacts, and isolation and other features as desired; and
16. Perform other steps, as desired.

The aforementioned steps are provided for the formation of a resonator device using a single crystal capacitor dielectric material configured on a membrane structure. In an example, the single crystal material can be AlN or GaN in other examples, while there can be variations. Of course, depending upon the embodiment, steps or a step can be added, removed, combined, reordered, or replaced, or has other variations, alternatives, and modifications. Further details of the present manufacturing process can be found throughout the present specification, and more particularly below.

In an example, the processing chamber is a deposition chamber. In an example, the processing chamber is a MOCVD or LPCVD chamber. In an example, the ammonia entity to TMA entity is provided at a ratio ranging between 300 to 5000 measured in a first volume flow of ammonia to a second volume flow of TMA. In an example, the TMA entities are produced by flowing nitrogen ($N_2$) gas into a liquid TMA bubbler source having a temperature controlled between 0 and +100 Degrees Celsius and the TMA entities are injected into the processing chamber alongside the $N_2$ gas provided to produce the TMA gas entities.

In an example, the method further comprises subjecting a surface region with a cleaning process; wherein the surface region is configured in an off-axis angle ranging from 0.2 to 7 Degrees relative to the <111> crystal orientation. In an example, the method can also comprise subjecting a surface region with a cleaning process; wherein the aluminum nitride material is deposited by LPCVD; whereupon the cleaning process, prior to the introducing of the TMA gas entities, comprises using dichlorosilane (DCS), provided with or without ammonia, to clean and prepare the surface region.

In an example, the first thickness of aluminum nitride material has a thickness of 0.5 microns and less. In an example, the method forms a second thickness of aluminum nitride material. In an example, the method forms a second thickness of aluminum nitride material; and forming an acoustic resonator device on at least the second thickness of aluminum nitride material. In an example, the method may also form a second thickness of aluminum nitride material, and may form a third thickness of aluminum nitride material on an opposite side of the first thickness having overlying the second thickness. In an example, the method forms an acoustic resonator device using at least a portion of the second thickness of aluminum nitride material and third thickness of aluminum nitride material.

In an example, the patterned carrier member is configured in as a plurality of hexagonal structures, a plurality of square structures, or a plurality of rectangular structures, or a plurality of other structures.

In an example, the first thickness of aluminum nitride material ranges from about 0.03 microns to about 0.50 microns; and wherein the first thickness of aluminum nitride material is characterized by X-ray diffraction with clear peak at a detector angle (2-θ) associated with single crystal film and whose Full Width Half Maximum (FWHM) is measured to be less than 1.0°. Further details of the present method and structures can be found throughout the present specification and more particularly below.

FIGS. 1 through 6 illustrate a simplified method for forming a membrane substrate structure for an acoustic resonator device according to an example of the present invention. Referring to FIG. 1, the method provides a substrate member 110 having a surface region. In an example, the method uses a CVD deposition (e.g. MOCVD) process to initiate growth of an aluminum nitride crystalline material. In an example, the method forms a thickness of about 200 nm of AlN nucleation 120 on <111> silicon substrate. In other examples, the AlN can range from about 30 nm to 500 nm, although there can be variations. In an example, the substrate member 110 has a high resistivity, such as greater than 2000 ohm-cm. In an example, the substrate 110 can be float zone (FZ)-type silicon or CZ low resistivity silicon may work in other examples. In an example, the substrate 110 can have a nominal substrate thickness of about 500 um, but can range from about 50 um and 2000 um in other examples.

In an example, the AlN crystalline material 120 is configured in a slight strained state given that the AlN crystalline material is not latticed matched perfectly with the <111> silicon substrate surface orientation. In an example, the strained state is characterized by the piezoelectric strain constant of the film along its surface normal (so-called $d_{33}$) and whose value is $4 \times 10^{-12}$ C/N for AlN on <111> silicon substrates.

Figure 2:
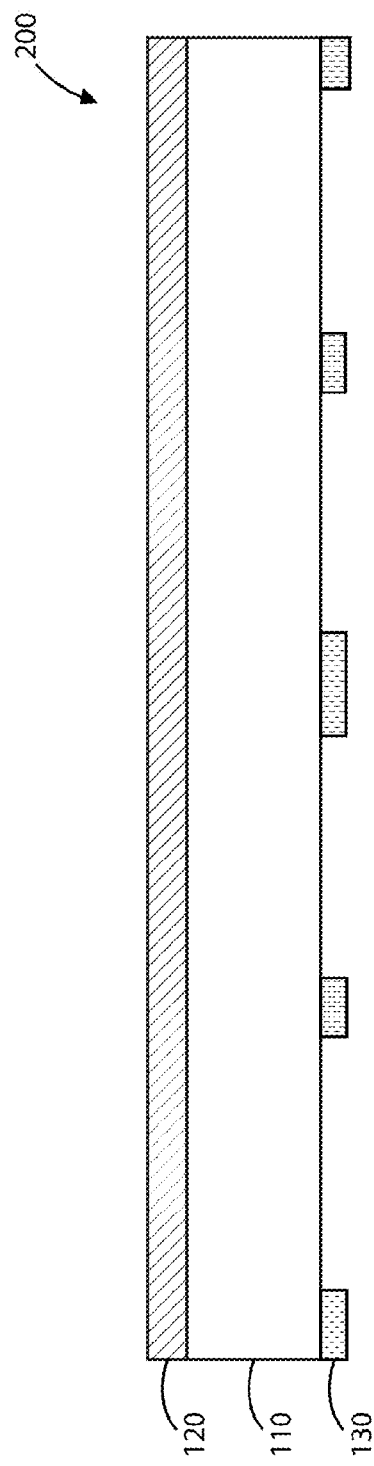

In an example, the method patterns a backside of the substrate member 110, as shown in FIG. 2. In an example, the method applies a backside mask 130 defining membrane area (e.g., square or rectangular) in an example. In an example, the backside mask 130 has a target area is 100 um×100 um, although there can be variations. In an example, the mask 130 is 300 um×300 um, or other variations.

In an example, as shown in FIG. 3, the method performs an etching process. In an example, the method performs a shallow etch of the exposed regions (substrate 111) of the backside substrate material underneath an active resonator area and a future landing pad (for via hole), although there can be variations. In an example, etching occurs using CF4 gas mixed with 02 gas in a reactive ion etch (RIE) tool at 100 W power and 100 mTorr. Each of the trenches has a depth of 30 um and may range from 20 um to 300 um, although there can be variations.

Referring to FIG. 4, the method now forms a subsequent backside mask 131 overlying selected rib and/or pillar regions, while exposing other pillar and/or rib regions. In an example, the mask is 600 um×600 um, although there can be variations.

In an example, the method now performs a deeper etching process to remove material from the substrate member 112 while exposing the crystalline material, which has been deposited. In an example, the method exposes both a piezo region and a landing pad metal region, as shown in FIG. 5.

Referring now to FIG. 6, the remaining mask material is removed. As shown, the membrane structure has a plurality of smaller rib structures 113 each of which is configured between a pair of pillar structure. In an example, each of the recessed regions ranges from about 300 um×300 um to about 500 um×500 um, and is preferably about 400 um×400 um.

In an example, exposure of portions of the crystalline AlN material causes a portion of such material to be relaxed. In an example, the AlN material has a piezoelectric strain constant ranging from 3.3×10-12 C/N to 4.5×10-12 C/N in the relaxed state, while there may be variations. Various patterns can be configured using the aforementioned method and related techniques. Further details of these patterns can be found throughout the present specification and more particularly below.

Figure 7:
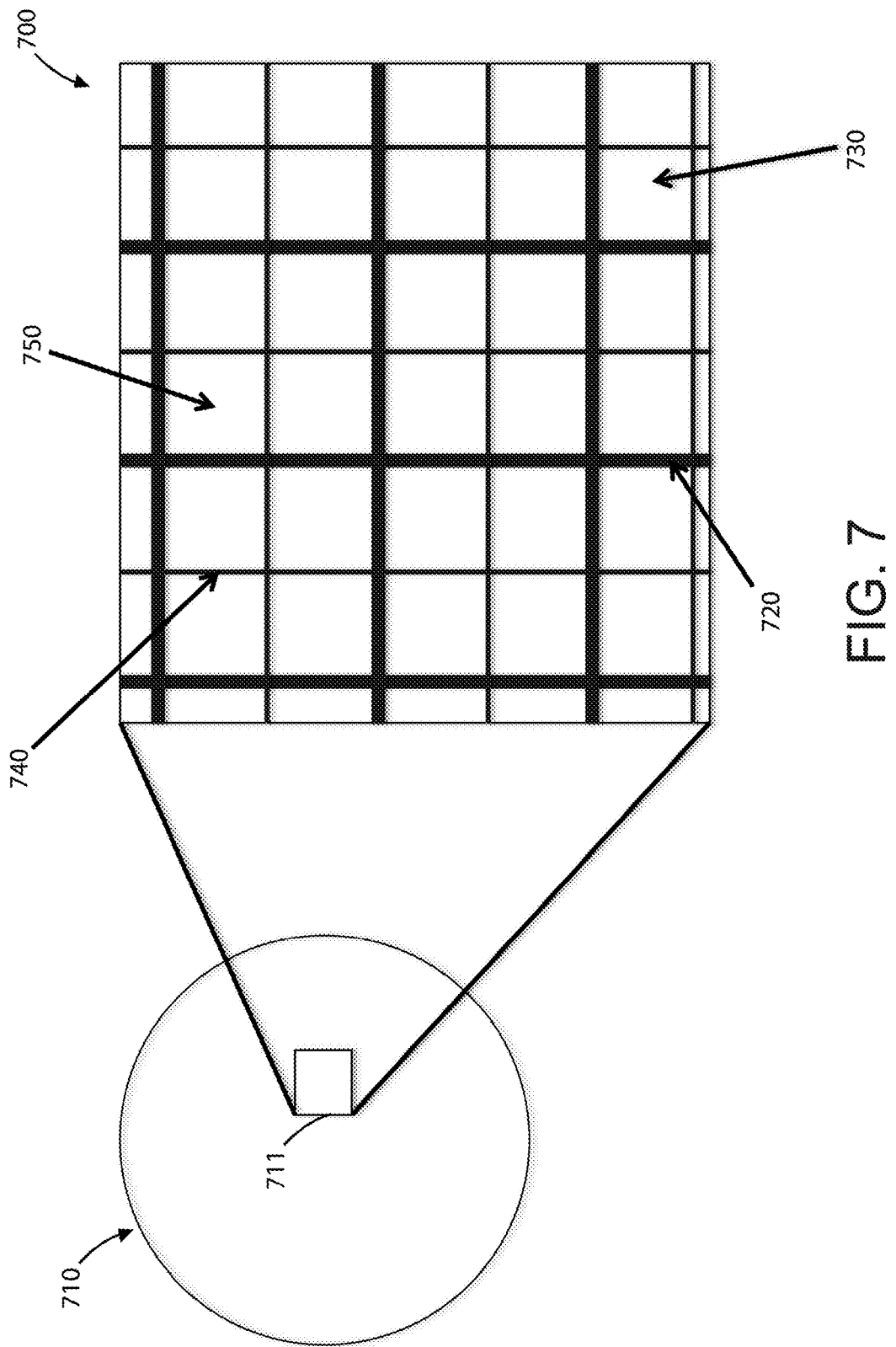
FIG. 7 is a simplified backside view of the membrane structure according to an example of the present invention.

FIG. 7 is a simplified backside view of the membrane structure 710 according to an example of the present invention. As shown, the backside view includes an expanded view 700 of region 711, which shows square pattern, including a plurality of smaller mechanical rib structures 740, each of which is configured within at least a pair of longer pillar structures or silicon support beams 720. The pattern also shows regions where the silicon is fully removed 730, exposing portions of the crystalline AlN material or X-by-Y piezo membrane 750 in an example.

Figure 8:
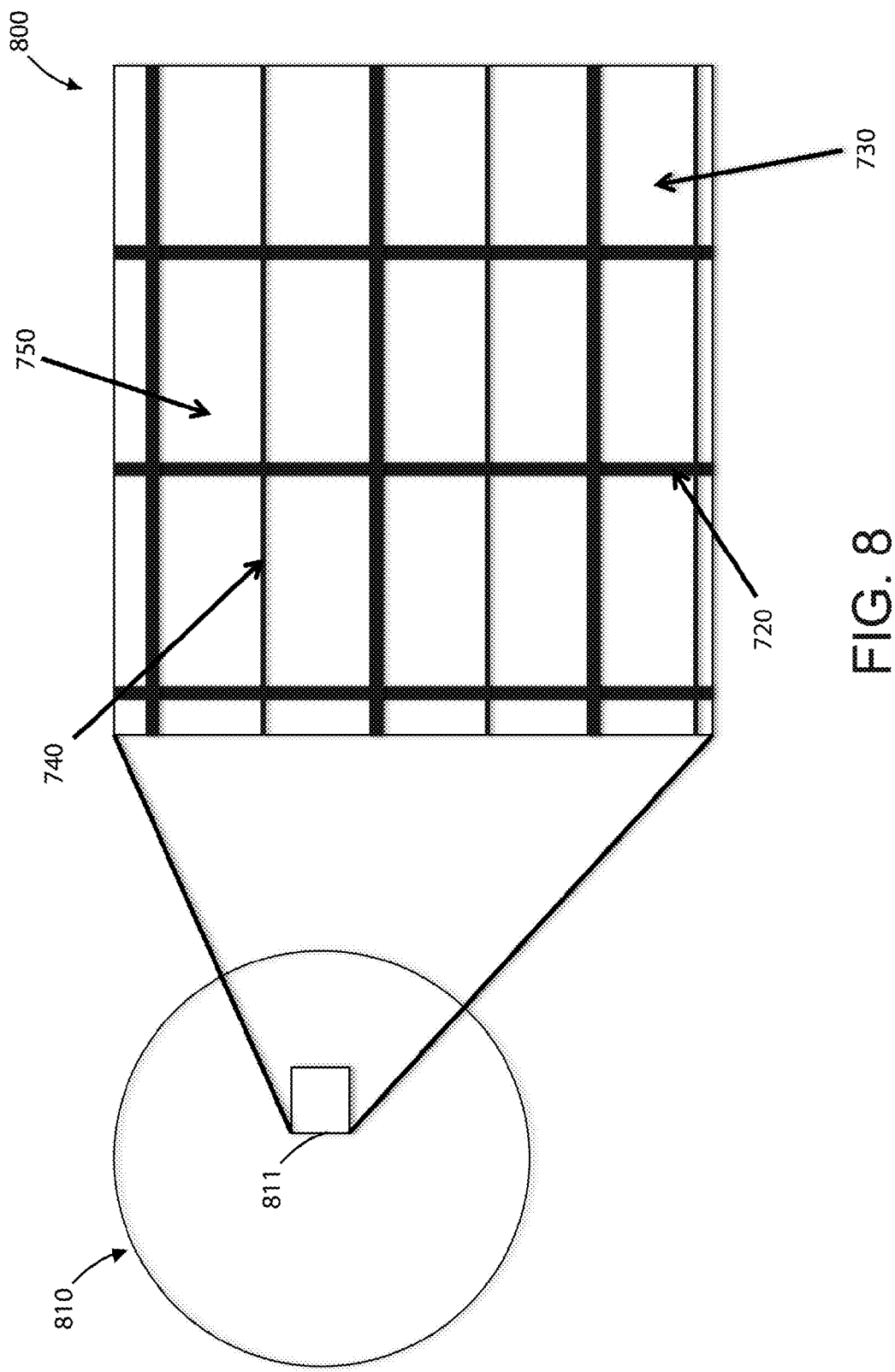
FIG. 8 is a simplified backside view of the membrane structure according to an alternative example of the present invention.

FIG. 8 is a simplified backside view of the membrane structure 810 according to an alternative example of the present invention. As shown, the backside view includes an expanded view 800 of region 811, which shows rectangular pattern, including a plurality of smaller mechanical rib structures, each of which is configured within at least a pair of longer pillar structures. The pattern also shows exposed portions of the crystalline AlN material in an example. The elements described here are similar to those shown in FIG. 7.

Figure 9:
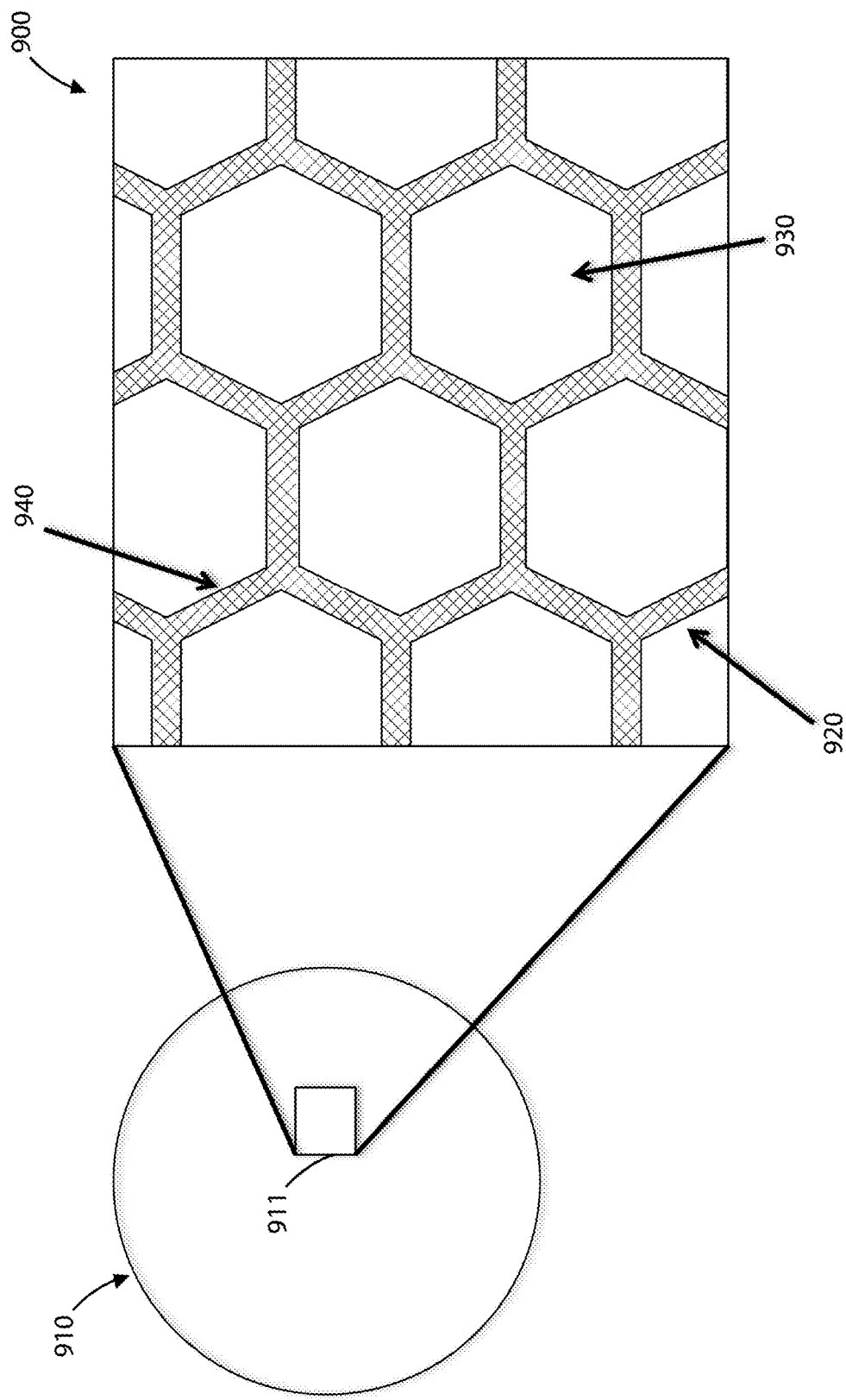
FIG. 9 is a simplified backside view of the membrane structure according to an alternative example of the present invention.

FIG. 9 is a simplified backside view of the membrane structure 910 according to an alternative example of the present invention. As shown, the backside view includes an expanded view 900 of region 911, which shows a hexagonal pattern, including a plurality of smaller mechanical rib structures, each of which is configured within at least a pair of longer pillar structures 920. The pattern also shows exposed portions 930 of the crystalline AlN material, exposing hexagonal membranes 940 in an example.

In other examples, the present technique can also form other shapes including rectangles, hexagons, octagons, pentagons, triangles, and others, including any variations, or combinations or any polygon. Other shapes can be circular, oval, annular, or lack any symmetrical features, including any combination of these shapes and related sizes. Of course, there can be other variations, modifications, and alternatives. Further details of forming the acoustic resonator device can be found throughout the present specification and more particularly below.

FIGS. 10 to 20 illustrate a method of manufacturing a single crystal resonator device on a substrate member in an example. This illustration is merely an example, and should not unduly limit the scope of the claims herein. In an example, the method includes forming an overlying single crystal piezo 121 overlying the crystalline material 120 formed on the silicon substrate 112 member having a first thickness. In an example, the substrate 112 has the single crystal piezo material 121, such as GaN, AlGaN, or AlN. The material has a thickness ranging from 0.4 um to 7 um, although there may be variations. This step can involve growing a single-crystal AlN on reduced strain AlN nucleation layers. In an example, a 2 um piezo is optimal thickness for 2 GHz. In an example, the substrate 112 can be silicon, sapphire, SiC, among others. In an example, the piezo material 121 is configured c-axis up orientation to achieve polarization field.

In an example, the single crystal acoustic resonator device comprises a resonator structure and a contact structure. As shown in FIGS. 10, 11 and 12, the substrate is a silicon substrate member 112, an overlying single crystal piezo material 122, and one or more electrode members 131, 132. The piezo material 122 can include the nucleation 120 and piezo layers 121, as shown in FIG. 11. FIG. 12 shows the deposition of topside electrodes 131, 132 and interconnect metal. In an example, the electrodes can be Mo, Ta or other refractory metal, typical thickness is 300 nm, with a range of 30 nm to 4000 nm or 0.2 um to 10 um, although there can be variations. Items 101 and 102 mark the regions of the first and second resonator devices, respectively. In an example, the metal that serves as a "catch pad" 133 for electrode contact region is deposited, as shown in FIG. 13. In an example, the "catch pad" 133 serves as a topside metal stop for for a backside via etch. The target thickness for pad 133 can be 2 um and include Ti/Ni metal stock or others.

Figure 14:
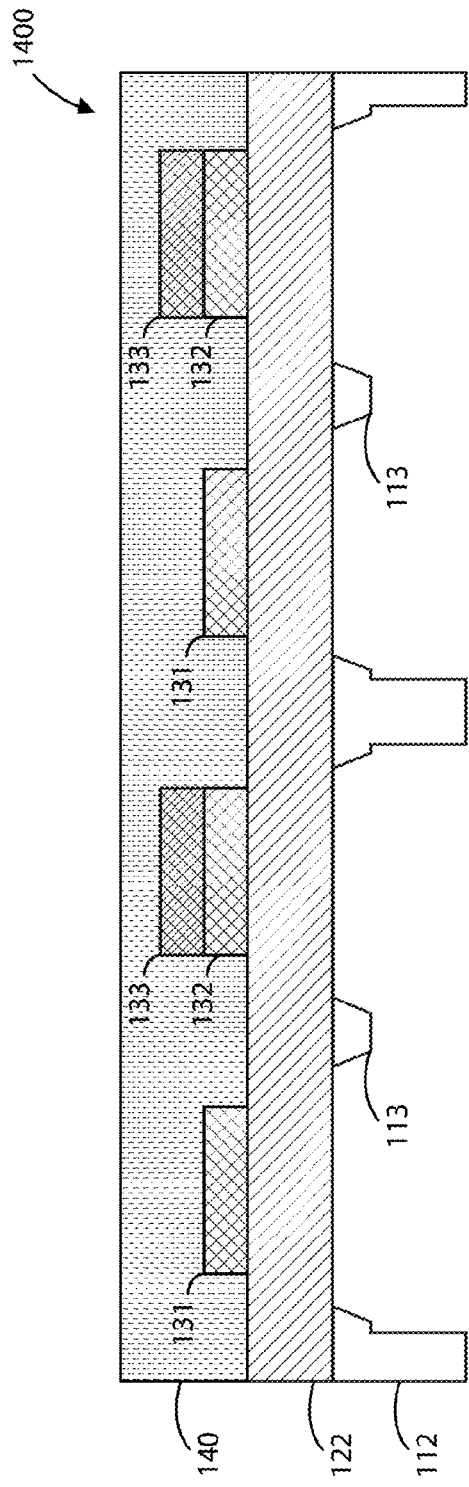

In an example, the method forms a passivation material 140 overlying the upper surface region including the electrode(s) and crystalline material, as shown in FIG. 14. An upper region of the passivation material 140 is planarized. In an example, the passivation material 140 can be a dielectric passivation (25 um of spin-on polymer photo-dielectric (e.g., ELECTRA WLP SH32-1-1) for mechanical stability. In an example in an alternative example, the method includes deposition of SiN and/or $SiO_2$ to provide suitable protection, isolation, and provide other features, if desired. The passivation 140 can provide scratch protection and can have a target thickness of about 0.5 um to 1 um.

Figure 15:
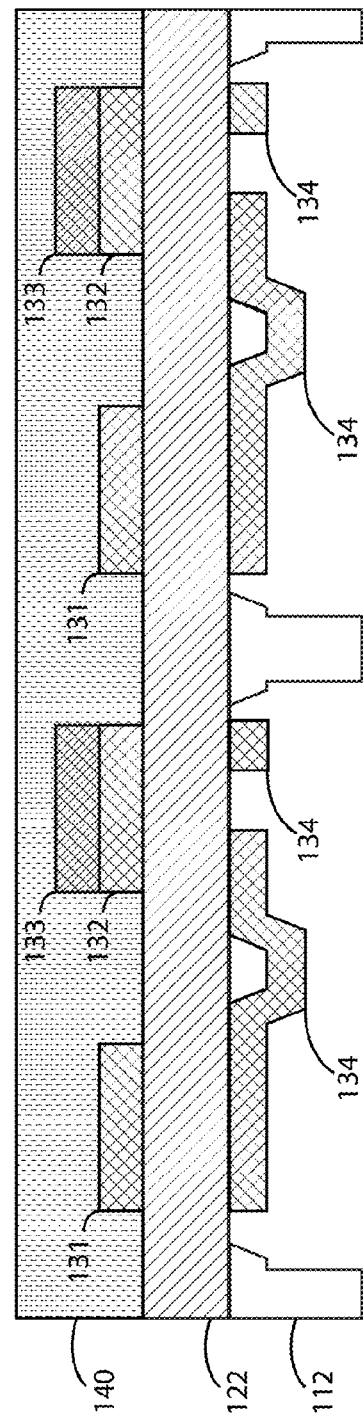
Figure 18:
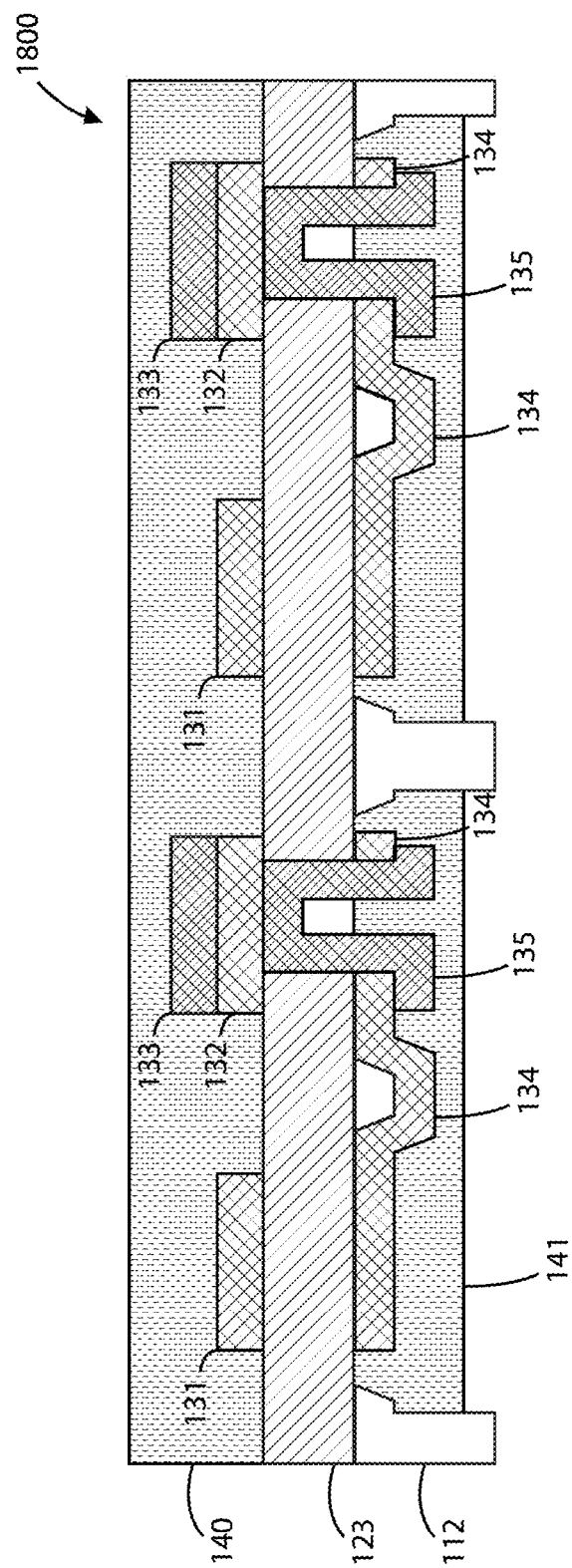

In an example referring to FIG. 15, the method forms a backside electrode member 134 configured as an interconnect. In an example, the electrode 134 can be a suitable material such as a refectory metal or others, such as Mo, Ta, others, and the like. In an example, the refractory metal can have a thickness of 300 nm, and can range from 100 nm to 500 nm.

In an example of FIG. 16, the method performs a backside via etch within a vicinity of a topside electrode region, as shown though piezo layer 123. In an example, the backside etch is provided to remove a portion of the crystalline piezo material to provide an electrical contact from backside to front side, as shown. In an example, the etch process can include a reactive ion etch process using BCl3, Ar gas, SF6 or others. In an example, the process uses a PlasmaTherm model 770 ICP-RIE operated at 7 mT, 20 sccm Cl2, 8 sccm of BCl3, 5 sccm of Ar at 400 W ICP and 25 W RIE. Of course, there can be variations. Alternatively, the contact opening can be formed via laser drilling and/or ablation techniques, while stopping on the backside of the electrode member, as shown.

In an example, the method now forms metallization 135 overlying the contact region to directly connect to the portion of the crystalline piezo material 123 and/or may include other interface materials in other examples. In an example, the metal 135 can be Aluminum, Titanium or Gold. In an example, the metal 135 provides an electrical contact from backside to front side, as shown. In an example, the metal 135 is thick to minimize via resistance and inductance in an example, the metal can be a combination of Ti/Al or Ti/Au (100 Å/2 um), among others.

In an example, the method now forms a fill material such as a dielectric passivation material 141 overlying the backside regions to fill the trench regions. In an example, the passivation 141 is for scratch protection, mechanical support, and electrical isolation, among other features. In an example, the passivation material 141 can be a dielectric passivation (0.5 to 1 um of spin-on polymer photo-dielectric (e.g., ELECTRA WLP SH32-1-1) for mechanical stability. In an example in an alternative example, the method includes deposition of SiN and/or SiO2 to provide suitable protection, isolation, and provide other features, if desired.

Figures 19, 20:
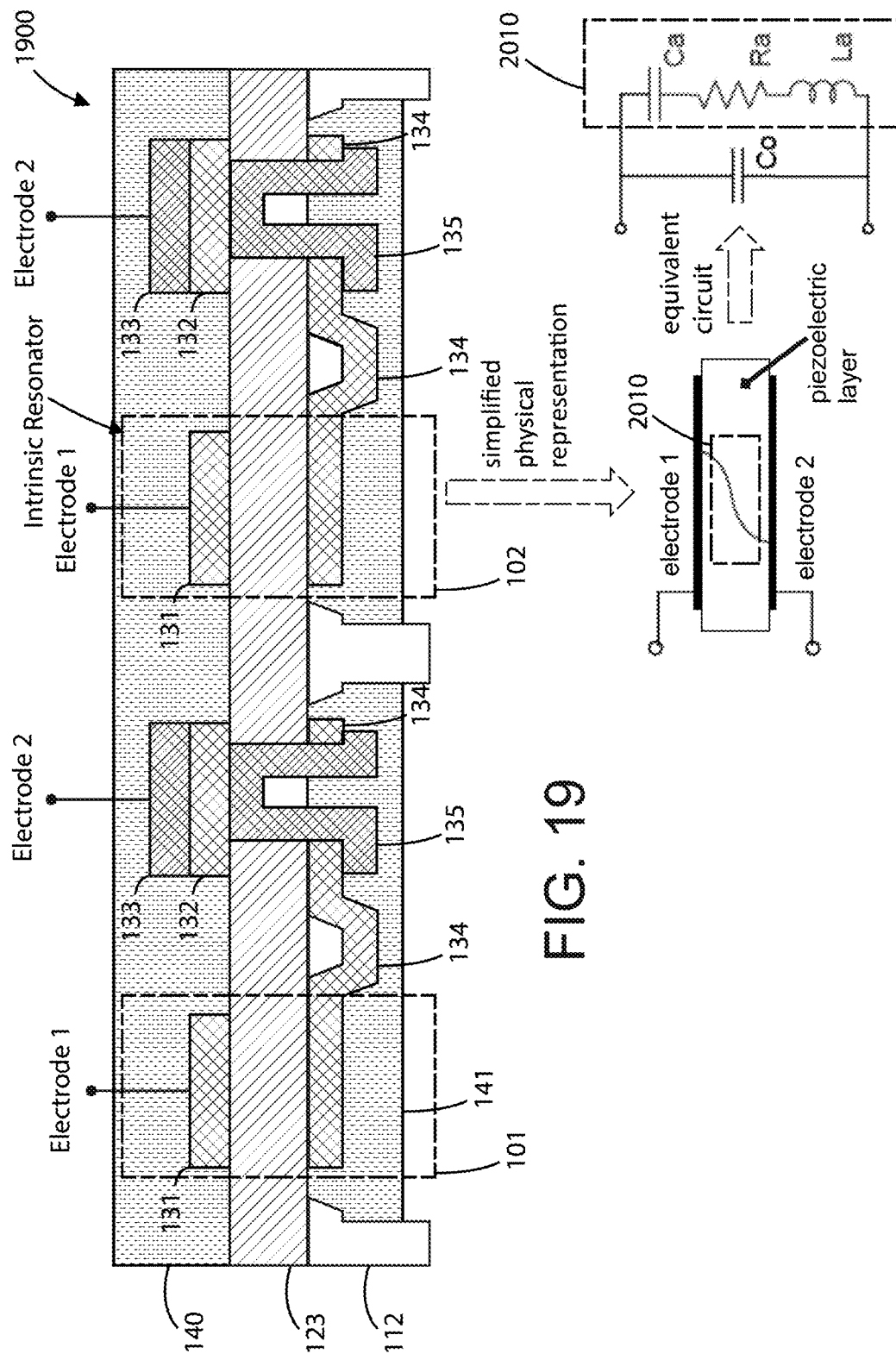

Referring to FIG. 19, a final acoustic resonator device is shown (prior to Cu-Pillar bumps), an example. The first and second resonator devices are marked in dotted regions 101 and 102, respectively. A related electronic circuit and structure are shown in FIG. 20 with equivalent regions 2010.

Figures 21A, 21B:
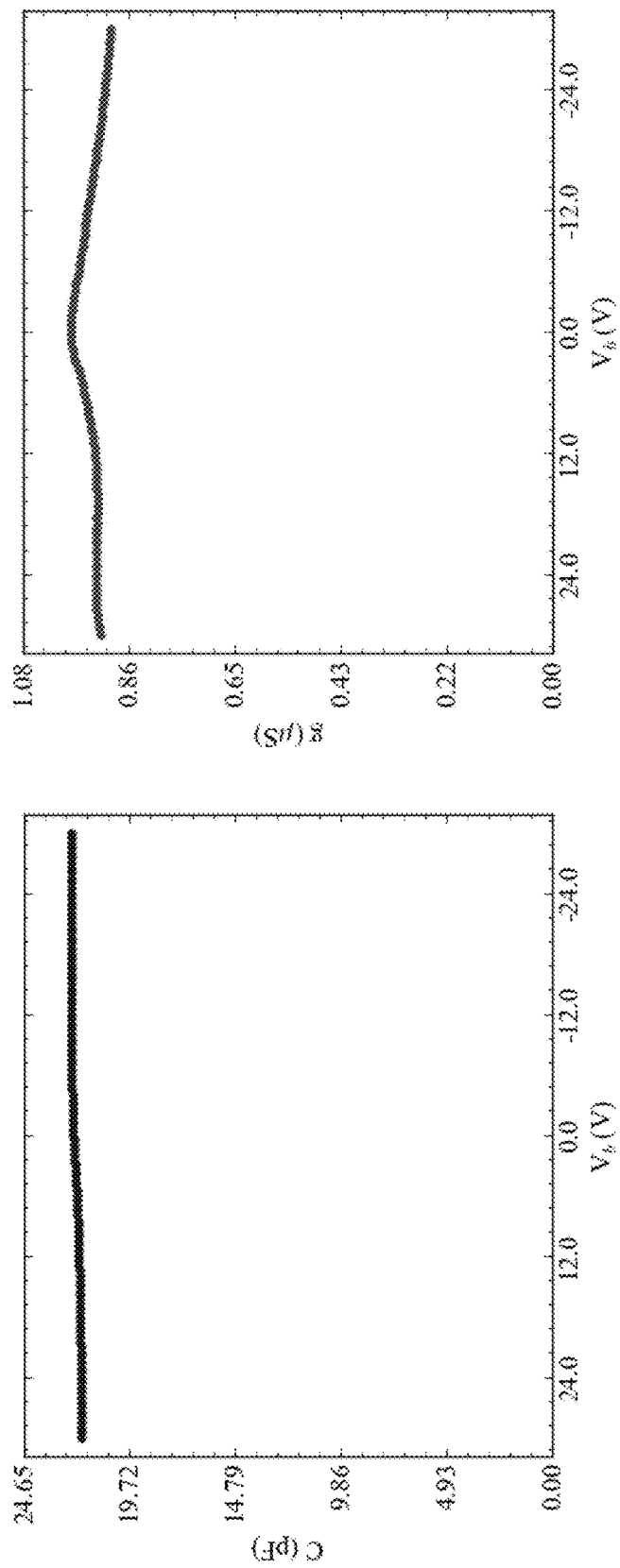
FIGS. 21A and 21B are plots illustrating capacitance versus voltage, and conductance versus voltage for the piezoelectric material in an example of the present invention.

FIGS. 21A and 21B are plots illustrating capacitance versus voltage, and conductance versus voltage, respectively, for the piezoelectric material in an example of the present invention. In an example, the thickness of single crystal piezo electric material of AlN produces an electrical capacitance characteristic verses voltage that shows the electrical capacitance characteristic being flat for an electric measurement frequency between 100 Hz and 1 MHz and a sweep voltage between −30 C and +30V. In an example, the thickness of single crystal piezo material also produces an electrical conductance characteristic verses voltage that is less than 10 mS that shows the electrical conductance being flat for an electric measurement frequency between 100 Hz and 1 MHz and a sweep voltage between −30 C and +30V. Of course, there can be variations.

Figure 22:
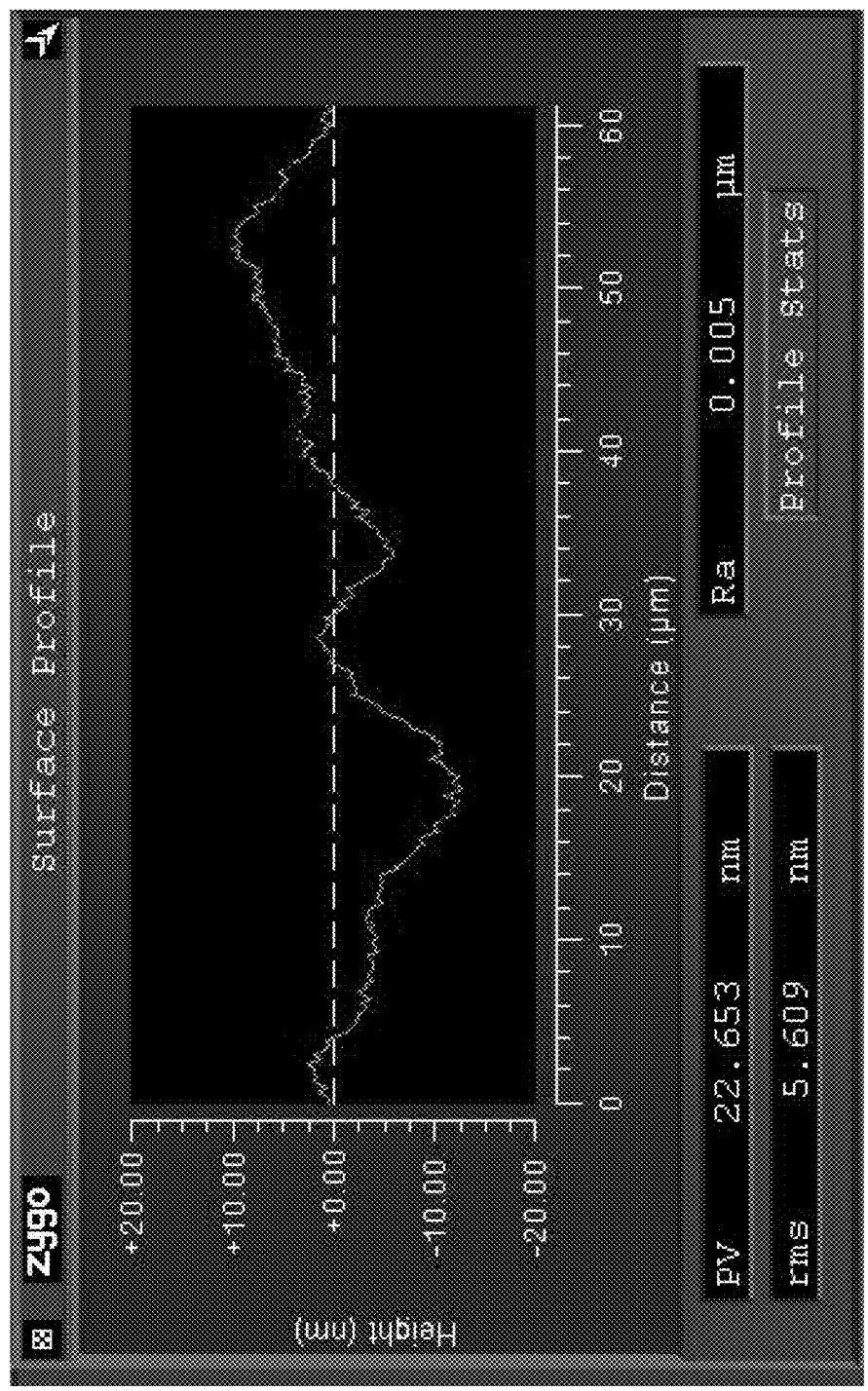
FIG. 22 is a plot illustrating surface roughness of the piezoelectric material across a 60 um surface region in an example of the present invention.

FIG. 22 is a plot illustrating surface roughness of the piezoelectric material across a 60 um surface region in an example of the present invention. In an example, the thickness of piezo electric material has a surface region characterized by a surface smoothness having an RMS characteristic of less than 100 nm, although there can be variations.

FIG. 23 is a simplified diagram illustrating growth of a single-crystal AlN material 121 overlying a top-side surface of reduced-strain AlN nucleation layer 120 configured on a silicon substrate member 112. In an example, the material has a target thickness of 1 um and may have a range of 0.2 um to 5um, although there can be variations. In an example, growth can occur using any of the techniques described herein, as well as outside of the present specification.

In an example, the substrate member is flipped and the method initiates growth of a single-crystal AlN material 123 overlying a backside surface of reduced-strain AlN nucleation layer, as shown in FIG. 24. As shown, the thickness of crystalline material 123 is conformal and overlies both smaller and larger rib structures including edges of the pillar structures to form a container of crystalline material. In an example, the backside growth 123 has a thickness of about 1 um and may range in thickness from about 0.2 um to 5um, although there may be variations. In an example, FIG. 25 shows a simplified representation of a single crystal piezoelectric material 124 configured on a silicon substrate member.

FIG. 26 shows an illustration of formation of topside electrodes 131, 132 (shown) and interconnect metal (not shown) in an example. Also shown are regions representative of each of the resonator devices 101, 102. In an example, the electrode can be Mo, Ta or other refractory metal, typical thickness is 300 nm, with a range of 30 nm to 4000 nm, although there can be variations. In an example, the device includes a metal serving as a "catch pad" 133 for electrode contact region in FIG. 27.

In an example, the method forms a passivation material 140 overlying the upper surface region including the electrode(s) and crystalline material, as shown in FIG. 28. An upper region of the passivation material is planarized. In an example, the passivation material can be a dielectric passivation (25 um of spin-on polymer photo-dielectric (e.g., ELECTRA WLP SH32-1-1) for mechanical stability. In an example in an alternative example, the method includes deposition of SiN and/or SiO2 to provide suitable protection, isolation, and provide other features, if desired.

Figure 29:
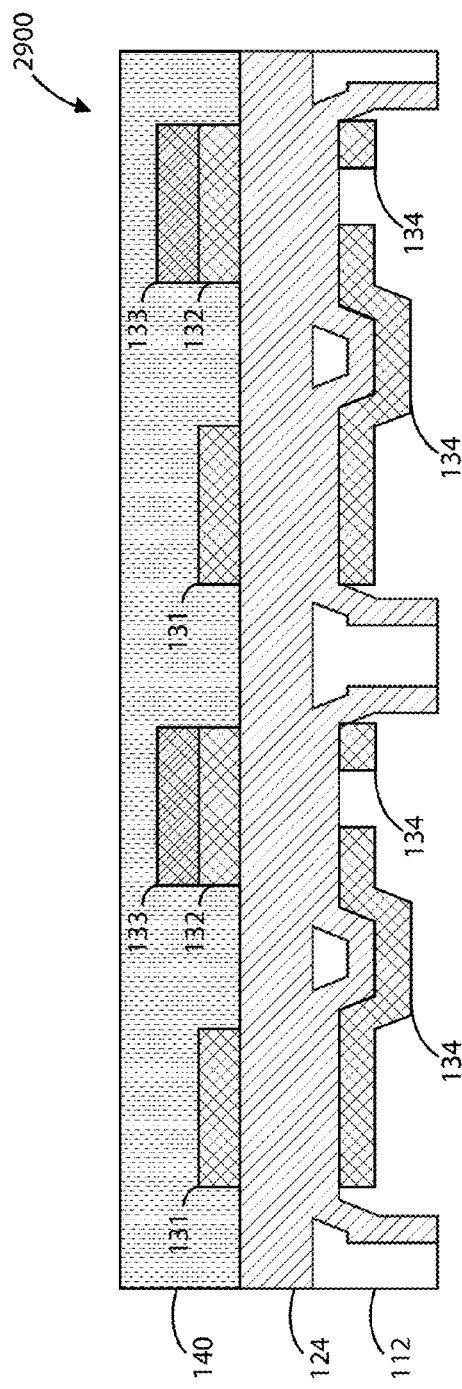

In an example referring to FIG. 29, the method forms a backside electrode member 134 configured as an interconnect. In an example, the electrode 134 can be a suitable material such as a refectory metal or others, such as Mo, Ta, others, and the like. In an example, the refractory metal can have a thickness of 300 nm, and can range from 100 nm to 500 nm.

Figure 30:
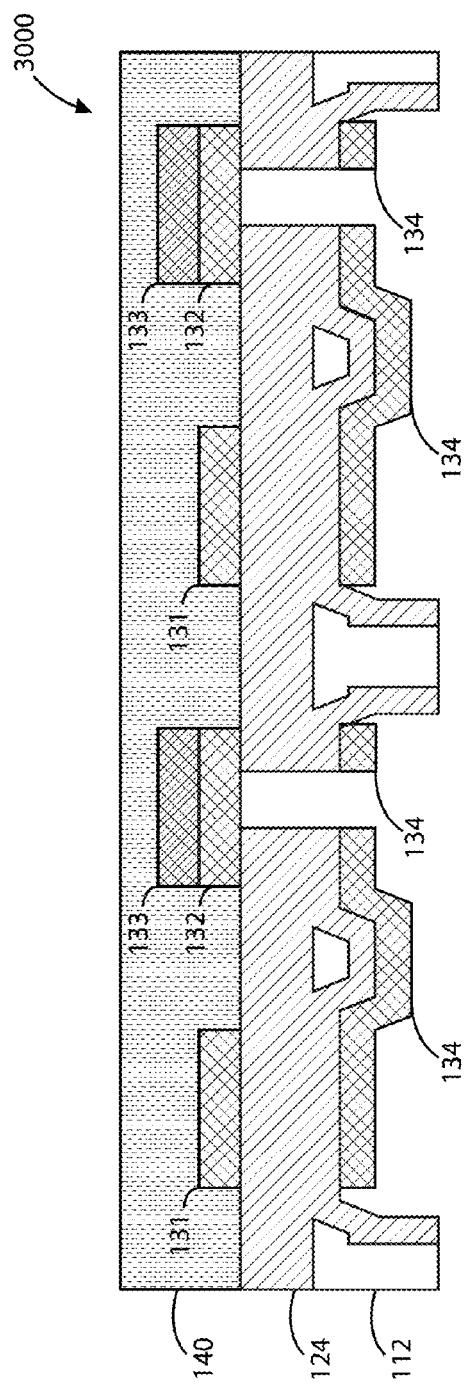

In an example of FIG. 30, the method performs a backside via etch within a vicinity of a topside electrode region, as shown through piezo layer 124. In an example, the backside etch is provided to remove a portion of the crystalline piezo material to provide an electrical contact from backside to front side, as shown. In an example, the etch process can include a reactive ion etch process using BCl3, Ar gas, SF6 or others. In an example, the process uses a PlasmaTherm model 770 ICP-RIE operated at 7 mT, 20 sccm Cl2, 8 sccm of BCl3, 5 sccm of Ar at 400 W ICP and 25 W RIE. Of course, there can be variations. Alternatively, the contact opening can be formed via laser drilling and/or ablation techniques, while stopping on the backside of the electrode member, as shown.

In an example, the method now forms metallization 135 (FIG. 31) overlying the contact region to directly connect to the portion of the crystalline piezo material and/or may include other interface materials in other examples. In an example, the metal can be Aluminum, Titanium or Gold or others, and combinations thereof, and the like. In an example, the metal provides an electrical contact from backside to front side, as shown. In an example, the metal is thick to minimize via resistance and inductance in an example, the metal can be a combination of Ti/Al or Ti/Au (100 Å/2 um), among others.

In an example, the method now forms a fill material such as a dielectric passivation material 141 overlying the backside regions to fill the trench regions, as shown in FIG. 32. In an example, the passivation 141 is for scratch protection, mechanical support, and electrical isolation, among other features. In an example, the passivation material 141 can be a dielectric passivation (0.5 to 1 um of spin-on polymer photo-dielectric (e.g., ELECTRA WLP SH32-1-1) for mechanical stability. In an example in an alternative example, the method includes deposition of SiN and/or SiO2 to provide suitable protection, isolation, and provide other features, if desired.

Referring to FIG. 33, a final acoustic resonator device is shown (prior to Cu-Pillar bumps), an example. A related electronic circuit and structure are shown in FIG. 34. Further detailed of packaging the subject device can be found throughout the present specification and more particularly below.

In an example, the method forms a patterned solder material structure or solder dam mask configured overlying the single crystal acoustic resonator device and the surface region to form a first air gap region provided from the patterned solder structure and configured between the resonator structure and a first portion of the mounting structure or mounting substrate member, wherein the first air gap structure or region having a height of 10 microns to 50 microns. In an example, the patterned solder structure has a patterned upper surface region.

In an example, the method forms a thickness of an epoxy material overlying the patterned upper surface region, while maintaining the resonator structure free from any of the epoxy material. In an example, the method positions a mounting substrate member to the epoxy material. In an example, the method cures the epoxy material to mate the single crystal acoustic resonator device to the mounting substrate member. In an example, the mounting substrate member is optically transparent. In an example, the mounting substrate member comprises a surface region. Further, in an example, the mounting substrate comprises of BF33 or BK7 glass material, and is selected to match temperature coefficient of expansion with the silicon substrate member.

In an example, the method processes the silicon substrate to remove a portion of the silicon substrate to form a resulting silicon substrate of a second thickness, the second thickness being less than the first thickness. In an example, the resulting silicon substrate has a silicon backside region.

In an example, the method performs a backside via and capacitor etch of the substrate. The etch exposes a portion of the landing pad and backside of piezo membrane. In an example, the etch can use a SF6 gas enables selective RIE process. Of course, there can be other variations, modifications, and alternatives.

In an example, the method forms metallization overlying the thinned substrate member, which can include a first electrode and second electrode. In an example, the method performs a topside capacitor plate (with the first electrode) and connect landing pad to topside plane (with the second electrode) deposition process. In an example, the plate and pad are made of a suitable material such as Mo, Ta or other refractory metal, among combinations thereof. In an example, the thickness of such layer ranges from 1000 Å to 10,000 Å, while 3000 Å is target thickness, although there can be variations. In an example, the layer has a titanium (Ti) cap metal may be used to prevent oxidation of refractory metal.

In an example, the method can also form via deposition a topside overlay metal material. In an example, the metal has a sufficient thickness for to act as a pad for probing and has low resistance for a high quality interconnect. In an example, the interconnect has Ti/Al (100 Å/2 um) as a target thickness, although there can be thicknesses of 0.5 um to 5 um. In an example, the method also provides formation of a solder dam mask or other fill material, which is patterned. The material is configured to protect the surface region from scratches, and has a thickness of 1 um to 50 um and a target thickness of 5 um, while there can be variations.

In an example, the method performs a bump process. In an example, the method includes forming a repassivation material overlying the solder dam mask material. In an example, the repassivation material has a first region exposing the first electrode member and a second region exposing the second electrode member.

In an example, the method includes forming an under metal material overlying the repassivation material and covering the first region and the second region such that the first electrode member and the second electrode member are each in electrical and physical contact with the under metal material. In an example, the metal material can be a Ti/Cu seed material, among others.

In an example, the method includes forming a thickness of resist material overlying the under metal material to cause a substantially planarized surface region. The resist material is developed and surface cleaned.

In an example, the method includes patterning the substantially planarized surface region of the thickness of resist material to expose a first region corresponding to the first electrode member and a second region corresponding to the second electrode member. In an example, the method includes filling the first region and the second region using a deposition process to form a first copper pillar structure overlying the first electrode member and a second copper pillar structure overlying the second electrode member.

In an example, the method includes forming a solder material overlying the first copper pillar structure and the second copper pillar structure. The method also processes the thickness of resist material to substantially remove the thickness of resist material and expose the under metal material.

In an example, the method also removes any exposed portions of the under metal material. The method subjects the solder material on the first copper pillar structure and the second copper pillar structure to cause formation of a first solder bump structure overlying the first copper pillar structure and a second solder bump structure overlying the second copper pillar structure. Further details of various resonator device structures can be found throughout the present specification, and more particularly in U.S. patent application Ser. No. 14/341,314, commonly assigned, and hereby incorporated by reference herein.

As used herein, the terms "first" "second" "third" and "nth" shall be interpreted under ordinary meaning Such terms, alone or together, do not necessarily imply order, unless understood that way by one of ordinary skill in the art. Additionally, the terms "top" and "bottom" may not have a meaning in reference to a direction of gravity, while should be interpreted under ordinary meaning. These terms shall not unduly limit the scope of the claims herein.

As used herein, the term substrate is associated with Group III-nitride based materials including GaN, InGaN, AlGaN, or other Group III containing alloys or compositions that are used as starting materials, or AlN or the like. Such starting materials include polar GaN substrates (i.e., substrate where the largest area surface is nominally an (h k l) plane wherein h=k=0, and l is non-zero), non-polar GaN substrates (i.e., substrate material where the largest area surface is oriented at an angle ranging from about 80-100 degrees from the polar orientation described above towards an (h k l) plane wherein l=0, and at least one of h and k is non-zero) or semi-polar GaN substrates (i.e., substrate material where the largest area surface is oriented at an angle ranging from about +0.1 to 80 degrees or 110-179.9 degrees from the polar orientation described above towards an (h k l) plane wherein l=0, and at least one of h and k is non-zero.).

As shown, the present device can be enclosed in a suitable package.

In other examples, GaN or a gallium and nitrogen containing material can be provided rather than AlN or an aluminum and nitrogen containing material. In an example, the GaN or the gallium and nitrogen containing material can be configured to a silicon substrate member having a surface orientation. Such GaN or gallium and nitrogen containing material can be provided using TMG rather than TMA, but there can be variations.

In an example, a molar flow ratio of ammonia to TMAl ranges between 10-5000 for formation of AlN and a molar flow ratio of $NH_3$ to TMGa ranges between 100-50,000 for formation of GaN (derived from $NH_3$/TMGa), although there can be variations.

While the above is a full description of the specific embodiments, various modifications, alternative constructions and equivalents may be used. As an example, the packaged device can include any combination of elements described above, as well as outside of the present specification. As used herein, the term "substrate" can mean the bulk substrate or can include overlying growth structures such as a gallium and nitrogen containing epitaxial region, or functional regions, combinations, and the like. Therefore, the above description and illustrations should not be taken as limiting the scope of the present invention which is defined by the appended claims.

What is claimed is:

1. A method for manufacturing a single crystal acoustic resonator device, the method comprising:
   providing a silicon substrate member having a surface region configured in a <111> surface orientation and a backside region, the silicon substrate being single crystal silicon;
   placing the silicon substrate member into a processing chamber configured with a temperature controlled surface containing the silicon substrate;
   increasing a temperature of the surface region;
   maintaining the surface region between 900C and 1200C to oblate the surface region having a silicon material and oblate any other unintentional species residing on the surface region;
   introducing at least nitrogen ($N_2$) and trimethyl aluminum (TMA) entities into the process chamber at a flow rate of 1 cubic-centimeter (cc) per minute; dissociating an aluminum species from the TMA to react with the silicon substrate to create a meta-stable surface layer of aluminum-rich species; introducing at least an ammonia ($NH_3$) entity into the process chamber with a minimum flow rate of 0.33 liters per minute;
   dissociating a nitrogen species form the ammonia entity;
   causing formation of a first thickness of aluminum nitride material, using at least the nitrogen species and the aluminum species, overlying the surface region to form a strained state from a lattice mismatch between the surface region of the silicon substrate material and the first thickness of aluminum nitride material;
   maintaining the silicon substrate member at a temperature greater than about 900 Degrees Celsius to 1200 Degrees Celsius during the formation of the first thickness of aluminum nitride material;
   subjecting the backside region to a thinning process to remove a thickness of the substrate member to a thickness ranging from 30 microns to about 300 microns;
   forming a plurality of patterns formed on the backside region to form a patterned silicon carrier member configured to expose a plurality of backside portions of the aluminum nitride material; and
   causing the first thickness of aluminum nitride material in the strained state to relax the first thickness of aluminum nitride material to form a supported membrane structure configured on the patterned carrier member.

2. The method of claim 1 wherein the ammonia entity to TMA entity is provided at a ratio ranging between 300 to 5000 measured in a first volume flow of ammonia to a second volume flow of TMA.

3. The method of claim 1 further comprising subjecting a surface region with a cleaning process; wherein the surface region is configured in an off-axis angle ranging from 0.2 to 7 Degrees parallel to the <111> crystal orientation.

4. The method of claim 1 further comprising subjecting a surface region with a cleaning process; wherein the aluminum nitride material is deposited by LPCVD; whereupon the cleaning process, prior to the introducing of the TMA entities, comprises using dichlorosilane (DCS), provided with or without ammonia, to clean and prepare the surface region.

5. The method of claim 1 wherein the first thickness of aluminum nitride material has a thickness of 0.5 microns and less.

6. The method of claim 1 wherein the processing chamber is a deposition chamber.

7. The method of claim 1 wherein the processing chamber is a MOCVD or LPCVD chamber.

8. The method of claim 1 wherein the TMA gas entities are produced by flowing nitrogen ($N_2$) gas into a liquid TMA bubbler source having a temperature controlled between 0 and +100 Degrees Celsius and the TMA gas entities are injected into the processing chamber alongside the $N_2$ gas provided to produce the TMA gas entities from the liquid TMA bubbler source.

9. The method of claim 1 wherein the aluminum nitride material ranges in thickness from about 0.03 microns to about 0.50 microns; and wherein the first thickness of aluminum nitride material is characterized by X-ray diffraction with clear peak at a detector angle (2-θ) associated with single crystal film and whose Full Width Half Maximum (FWHM) is measured to be less than 1.0°.

10. The method of claim 1 wherein the patterned carrier member is configured in as a plurality of hexagonal structures, a plurality of square structures, or a plurality of rectangular structures, or a plurality of other structures.

11. The method of claim 1 further comprising forming a second thickness of aluminum nitride material.

12. The method of claim 1 further comprising forming a second thickness of aluminum nitride material; and forming an acoustic resonator device on at least the second thickness of aluminum nitride material.

13. The method of claim 1 further comprising forming a second thickness of aluminum nitride material; forming a third thickness of aluminum nitride material on an opposite side of the first thickness having overlying the second thickness; and forming an acoustic resonator device using at least a portion of the second thickness of aluminum nitride material and third thickness of aluminum nitride material.

14. The method of claim 1 wherein the first thickness of aluminum nitride material produces an electrical capacitance characteristic verses voltage that shows the electrical capacitance characteristic being flat for an electric measurement frequency between 100 Hz and 1 MHz and a sweep voltage between −30 C and +30V.

15. The method of claim 1 wherein the first thickness of aluminum nitride material produces an electrical conductance characteristic verses voltage that is less than 100 mS that shows the electrical conductance being flat for an electric measurement frequency between 100 Hz and 1 MHz and a sweep voltage between −30 C and +30V.

16. The method of claim 1 wherein the first thickness has a surface region characterized by a surface smoothness having an RMS characteristic of less than 100 nm.

* * * * *